United States Patent
Cho et al.

(10) Patent No.: US 6,282,121 B1
(45) Date of Patent: Aug. 28, 2001

(54) FLASH MEMORY DEVICE WITH PROGRAM STATUS DETECTION CIRCUITRY AND THE METHOD THEREOF

(75) Inventors: Tae-Hee Cho, Suwon; Seok-Cheon Kwon, Sungnam-shi, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/656,321

(22) Filed: Sep. 6, 2000

(30) Foreign Application Priority Data

Sep. 6, 1999 (KR) .................................................. 99-37725
Jan. 6, 2000 (KR) .................................................. 00-00497

(51) Int. Cl.[7] ..................................................... G11C 7/00
(52) U.S. Cl. ..................................... 365/185.22; 365/201
(58) Field of Search ......................... 365/185.22, 230.01, 365/189.05, 230.08, 189.01, 201

(56) References Cited

U.S. PATENT DOCUMENTS 5,299,162 * 3/1994 Nguyen ................................. 365/201

* cited by examiner

Primary Examiner—Terrell W Fears
(74) Attorney, Agent, or Firm—Marger Johnson & McCollom, P.C.

(57) ABSTRACT

A nonvolatile semiconductor memory device includes a program state detection circuit for checking a state of programmed memory cells. The program state detection circuit checks program pass/fail using data transmitted through a column selection circuit, according to a column address having redundancy information. Therefore, it is possible to overcome the problem that the memory device is regarded as a fail device owing to a defective column.

15 Claims, 16 Drawing Sheets

(Program pass)

(Program fail)

FLASH MEMORY DEVICE WITH PROGRAM STATUS DETECTION CIRCUITRY AND THE METHOD THEREOF

This application relies for priority upon Korean Patent Application No. 1999-37725, filed on Sep. 6, 1999 and No. 2000-497, filed on Jan. 6, 2000, the contents of which are herein incorporated by reference in their entirety.

FIELD OF THE INVENTION

The present invention relates to a nonvolatile semiconductor memory device and, more particularly, to a NAND-type flash EEPROM (electrically programmable and erasable read only memory) device with program status detection circuitry and the method thereof.

BACKGROUND OF THE INVENTION

Programming a NAND-type flash EEPROM device is operable with the repetitive cycles of programming, data read-out, and program verifying, and Y-SCAN. Specifically, during the program cycle, EEPROM cells associated with a selected page (i.e., a word line) are programmed into a desired data state. The data read-out operation of the programmed cells is then performed. Finally, the verifying operation is carried out in order to check whether the programmed cells are situated in the desired data state. If at least one of the programmed cells does not correspond to the desired state, the above program cycles are continuously performed for predetermined times. To this end, most of flash memory devices include a program status detection circuit to determine PASS or FAIL, informing of a result of the programming.

A program status detection circuit for flash memories, for example, is disclosed in U.S. Pat. No. 5,299,162, entitled "NONVOLATILE SEMICONDUCTOR MEMORY DEVICE AND AN OPTIMIZING PRGRAMMING METHOD THEREOF".

FIG. 1 illustrates the program status detection circuitry disclosed in the above-mentioned document. Referring now to FIG. 1, each of bitlines BL1–BL1024 is coupled to a NAND-structured cell string (CE) composed of a serial-connected transistor ST, eight cell transistors CT1–CT8, and a ground selection transistor GT. The string selection transistor ST and the ground selection transistor GT have a MOS transistor structure. Gates are coupled to selection lines SL1 and SL2, respectively. Each of the cell transistors CT1–CT8 has a structure of a depletion MOS transistor having a floating gate placed between a control gate and a substrate. Each control gate is coupled to each of the control lines CL1–CL8. Each of the bitlines (BL1–BL1024) is coupled to each of high voltage supply circuits HV for supplying program voltage with positively high level, each of bitline latch circuits LT on which externally inputted data is loaded, a current source circuit CS for supplying detection current during program detection operation, and each of program check units PC for inverting data of the bitline latch circuit LT.

The high voltage supply circuit HV is a charge pump circuit composed of transistors PT1 and PT2 and a pumping capacitor C1. A drain of the transistor PT1 is coupled to program voltage Vpp, a gate thereof is coupled to a bitline BL1, and a source thereof is coupled to a gate of a transistor PT2. A drain of the transistor PT2 is coupled to one electrode of a pumping capacitor C, and a source thereof is coupled to the bitline BL1. When a clock signal Øpp goes to high level, the pumping capacitor C discharges charge stored in a capacitor C to the bitline BL1 through the transistor PT2 and supplies erase voltage and program inhibit voltage to the bitline.

The bitline latch circuit LT is formed of two inverters INV1 and INV2, and a transfer transistor TT1. The inverters INV1 and INV2 are coupled to each other, coupling an input of one of them to an output of the other. A gate of the transfer transistor TT1 is coupled to a clock signal Ø1, a first current terminal (drain or source) thereof is coupled to a bitline, and a second terminal thereof (source or drain) is coupled to an input of the inverter INV2. Thus, the bitline latch circuit LT receives and holds external data applied to the bitline through the transfer transistor TT1 being turned on when the clock signal Ø1 is on high potential.

The current source circuit CS includes a plurality of output circuits OS coupled to each of bitlines and a common reference current setting circuit RC. The circuits RC and OS are coupled to each other in the form of a current mirror circuit so as to establish reference current against all the output circuits OS. The common reference current setting circuit RC comprises a P-channel MOS transistor M1, coupled between power supply voltage Vcc and ground voltage Vss, and N-channel MOS transistors M2 and M3. A drain and a gate of the P-channel MOS transistor M1 are coupled to each other. A gate of the N-channel MOS transistor M2 is coupled to reference voltage Vref, and that of the N-channel MOS transistor M3 is coupled to a clock signal Ø2. Each of the output circuits OS has a P-channel MOS transistor M4, coupled between the power supply voltage Vcc and each of the bitlines, and an N-channel MOS transistor M5. A gate of the P-channel MOS transistor is coupled to that of the P-channel MOS transistor. A gate of the N-channel MOS transistor M5 is coupled to the clock signal Ø2. Thus, the current source circuit CS is enabled when the clock signal Ø2 goes to a high level, so that drain current of the P-channel MOS transistor M4, i.e., verifying current, is supplied to the bitline BL1.

The program check circuit PC includes a MOS transistor M6. A drain of the MOS transistor M6 is coupled to an input of the inverter INV1, a source thereof is coupled to the ground voltage Vss, and a gate thereof is coupled to a bitline. If the verifying current applied to the bitline dose not flow to a ground through a NAND-structured cell string including a selected cell, the bitline goes to high level and consequently the MOS transistor M6 (program verifying unit) is turned on. This makes the input of the inverter INV1 go to low level (e.g., ground voltage). Thus, when programming the selected cell is insufficient, the program check circuit PC detects an insufficient programming state and then invert a data logic level of the bitline latch circuit LT.

In FIG. 1, there is program status detection circuit PS. When all the selected cells are programmed with an optimal state, the circuit PS outputs a normal detection signal. When at least one of the selected cells is insufficiently programmed, the circuit PS outputs an abnormal detection signal. The circuit PS includes a P-channel MOS transistor M7 and a depletion MOS transistor M8. The P-channel MOS transistor M7 serves as a pull-up circuit for pulling up a node N1, and the depletion MOS transistor M8 serves as a pull-up load. A source of the P-channel MOS transistor is coupled to the power supply voltage Vcc, a gate thereof is coupled to a clock signal Ø3, and a drain thereof is coupled to a source of the depletion MOS transistor M8. A gate and a drain of the depletion MOS transistor M8 are coupled to the node N1. A plurality of N-channel MOS transistors PD1–D1024, serving as a pull-down circuit PD, are coupled between the node N1 and a ground voltage Vss in parallel.

A gate of each of the MOS transistors is coupled to an inverted output $\overline{Q}$ of the bitline latch circuits LT. The node N1 is coupled to one input terminal of a NOR-type gate G through an inverter INV3. The other of the NOR-type gate G is coupled to a clock signal $\overline{\emptyset 4}$.

Program and verifying operations of the nonvolatile semiconductor memory device shown in FIG. 1 will be described more fully hereinafter.

First, an erase operation for making a threshold voltage of a cell into a negative level is performed before programming data into a cell. After completion of the erase operation, external data is loaded on the bitline latch circuit LT. At this time, logic high level is loaded to data "1" and logic low level is loaded to data "0". When the clock signal $\emptyset 1$ is at high level, the data is loaded on the bitline latch circuit LT. If the data held thereon is at high level, the high voltage supply circuit LT is operated to set a voltage on a bitline as a program inhibit voltage. Because voltage difference between a gate and a drain of a selected cell transistor (e.g., CT6) is insufficient for generation of F-N tunneling, the selected cell transistor CT6 has a negative threshold voltage.

When the data loaded on the bitline latch circuit LT is at low level, the high voltage supply circuit HV is not operated and retains 0V on the bitline. Accordingly, because the F-N tunneling is generated by the voltage difference therebetween, charges are injected into a floating gate and consequently the cell threshold voltage goes to a positive level. However, insufficient programming prevents the selected cell transistor from obtaining the set positive threshold voltage. To check whether cells are correctly programmed after completion of the program operation, the current source CS is operated in response to a high status of the clock signal $\emptyset 2$ and consequently verifying current is supplied to the bitline BL. The control lines CL1–CL5, CL7, and CL8 receive the power supply voltage Vcc and the control line CL6 receives a predetermined verifying voltage (e.g., +0.8V). When the threshold voltage of the selected cell transistor CT6 goes to a negative level, the verifying current flows to the ground through the cell string CE. Thus, the bitline BL1 retains 0V.

When the threshold voltage of the selected cell goes to a positive level (Vth>0.8V), the bitline BL1 goes to a high level because the verifying current dose not flow through the cell string CE. When the selected cell is insufficiently programmed (it means that the threshold voltage thereof is lower than 0.8V), the verifying current flows to the ground and the bitline BL1 still retains 0V.

During program verifying operation, the transistor M6 for checking a program is turned off when the bitline of the selected cell is laid on a low level. As a result, data stored in the bitline latch circuit LT is not inverted to make data "0" of an initially loaded state be held on an output Q. Since data "1" is held on an inverted version $\overline{Q}$ of the output Q, the pull-down transistor PD1 of the program status detection circuitry PS coupled to the version $\overline{Q}$ is continuously turned on. Therefore, the program is abnormally performed to make a clock signal $\emptyset 5$ of the program status detection circuitry PS retain a low level.

During reprogram operation, the data "0" of the bitline latch circuit LT is supplied to the bitline BL1 within a high interval of the clock signal $\emptyset 1$ again. Charges are repeatedly injected into the floating gate of the insufficiently programmed cell, so that the threshold voltage of the cell has a higher positive voltage. If the program cycles are sequentially carried out to charge up the threshold voltage of the selected cell having the higher positive voltage and consequently the selected cell is not turned on by the verifying voltage (0.8V), the bitline goes to a high level to turn on the transistor M6. Thus, the data "0" loaded on the output Q of the bitline latch circuit LT is inverted to data "1" and data "1" of the inverted version $\overline{Q}$ is inverted to data "0". So the pull-down transistors PD1 of the program status detection circuitry PS is turned off. By these repeated operations, complementary outputs $\overline{Q}$ of all the bits (i.e., all the bit line latch circuits) of the page buffer PB go to data "0". When the all the complementary outputs $\overline{Q}$ go to a low level, the clock signal $\emptyset 5$ of the program status detection circuitry PS goes to a high level. That is, all the selected cells are programmed with a required status.

As known by the above description, a nonvolatile semiconductor memory device having a program status detection circuitry shown in FIG. 1 can simultaneously verify a program status of cell transistors related to one page. However, a conventional nonvolatile semiconductor memory device is regarded as a fail device and causes deterioration of a yield. Hereinafter, this will be described in detail.

Referring now to FIG. 2, when two adjacent bitline latch circuits LT1 and LT2 are electrically connected to each other as indicated by a dotted line, as apparent to those skilled in the art, bit lines BL1 and BL2 coupled to the circuits LT1 and LT2 substitute for redundant bitlines (not shown) supplied to a cell array. However, because complementary outputs $\overline{Q}$ of the bitline latch circuits LT1 and LT2 always have logic states being contrary to each other, one of the pull-down transistors PD1 and PD2 coupled to the complementary outputs $\overline{Q}$ is always turned on during the program verifying operation. For example, if the bitline BL1 or BL2 is set to a low level, the bitline BL2 or BL1 electrically connected thereto is also set to the low level. As a result, the complementary output $\overline{Q}$ of the bitline latch circuit LT1 goes to a high level, as shown in FIG. 2. This makes the pull-down transistor PD1 coupled to the complementary output $\overline{Q}$ turned on, so that the program status detection circuitry PS outputs low-leveled clock signal $\emptyset 5$ indicating program fail until a series of the program operation and the program verifying operation are repeated as many as predetermined times. That is, the nonvolatile semiconductor memory device is regarded as a fail device.

If any bitline is coupled to a ground voltage (it is regarded as a defective column to substitute for a redundant bitline), a complementary output $\overline{Q}$ of a bitline latch circuit coupled to a grounded bitline always retains a high level. Consequently, a program state detection circuitry PS outputs a low-leveled click signal $\emptyset 5$ indicating program fail. If a cell transistor, which will be programmed, is continuously at an erase state (a bitline coupled to a cell string having the cell transistor of the erase state substitutes for a corresponding redundant bitline), the complementary output $\overline{Q}$ always retains a high level. Consequently, the program status detection circuitry PS outputs the low-leveled clock signal $\emptyset 5$.

As mentioned above, although defective bitlines substitute for redundant bitlines, a conventional program status detection circuitry always outputs a low-leveled clock signal indicating program fail owing to the defective bitlines. Therefore, a nonvolatile semiconductor memory device is regarded as a fail device and causes deterioration of a yield.

SUMMARY OF THE INVENTION

Therefore, it is a feature of the invention to provide a nonvolatile semiconductor memory device having a program status detection circuitry which can suppress yield deterioration caused by a defective column, and the method thereof.

According to the invention, a nonvolatile semiconductor memory device is a NAND-type flash memory device and has a program cycle performed by a series of program operation, program verifying operation, and Y-SCAN operation. The memory device comprises a memory cell array, a page buffer circuit, an address counter, a column selection circuit, a count-up signal generator, and a program pass/fail check circuit. The memory cell array includes a plurality of rows, a plurality of columns, a plurality of redundant columns, and a plurality of memory cells which are arranged at cross regions of the rows and columns, respectively. The page buffer circuit reads out data bits programmed from the memory cell array through the columns and holds the read-out programmed data bits. The address counter generates a column address in response to a count-up signal during Y-SCAN operation. The column selection circuit selects the columns in response to the column address, and comprises a column decoder for decoding a column address outputted from the address counter, a column gate circuit for selecting the columns in response to the column address decoded by the column decoder, and a redundancy circuit for receiving the column address. If columns corresponding to the column address include at least one defective column, the redundancy circuit enables the column decoder and substitutes the defective column for a corresponding redundant column through the column gate circuit.

When, among the programmed data bits held to the page buffer circuit, the count-up signal generator, program data bits corresponding to the selected columns are involved in a program state, the count-up signal generator generates the count-up signal during the Y-SCAN operation. The count-up signal generator comprises a data status detection circuitry and an oscillator. The data status detection circuitry detects whether the programmed data bits corresponding to the selected columns are involved in the program status, respectively, to generate an oscillation control signal. The oscillator generates the count-up signal in response to the oscillation control signal. Namely, when all of the programmed data bits corresponding to the selected columns are involved in the program state, the data status detection circuitry enables the oscillation control signal to enable the count-up signal for increasing the column address. When at least one of the programmed data bits are involved in an insufficiently programmed state, the data status detection circuitry disables the oscillation control signal to disable the count-up signal.

The program pass/fail check circuit generates a pass/fail flag signal involved in one of program pass and program fail in response to the count-up signal and the column address. When the oscillation control signal is enabled and all bits of the column address is at a high level, the program pass/fail check circuit generates the high-leveled pass/fail flag signal involved in the program pass. When the oscillation control signal is disabled or is enabled and at least one of the column address bits is at a low level, the program pass/fail check circuit the low-leveled pass/fail flag signal involved in the program fail.

Program/pass check operation is performed using data bits selected by a column gate circuit in accordance with a column address including redundancy information. Therefore, a defective bitline (or defective bitlines) cannot have an influence upon the program pass/fail check operation.

DESCRIPTION OF THE PREFERRED EMBODIMENT

The preferred embodiments of the invention will be described in detail with reference to attached drawings.
(First Embodiment)

Figure 1:
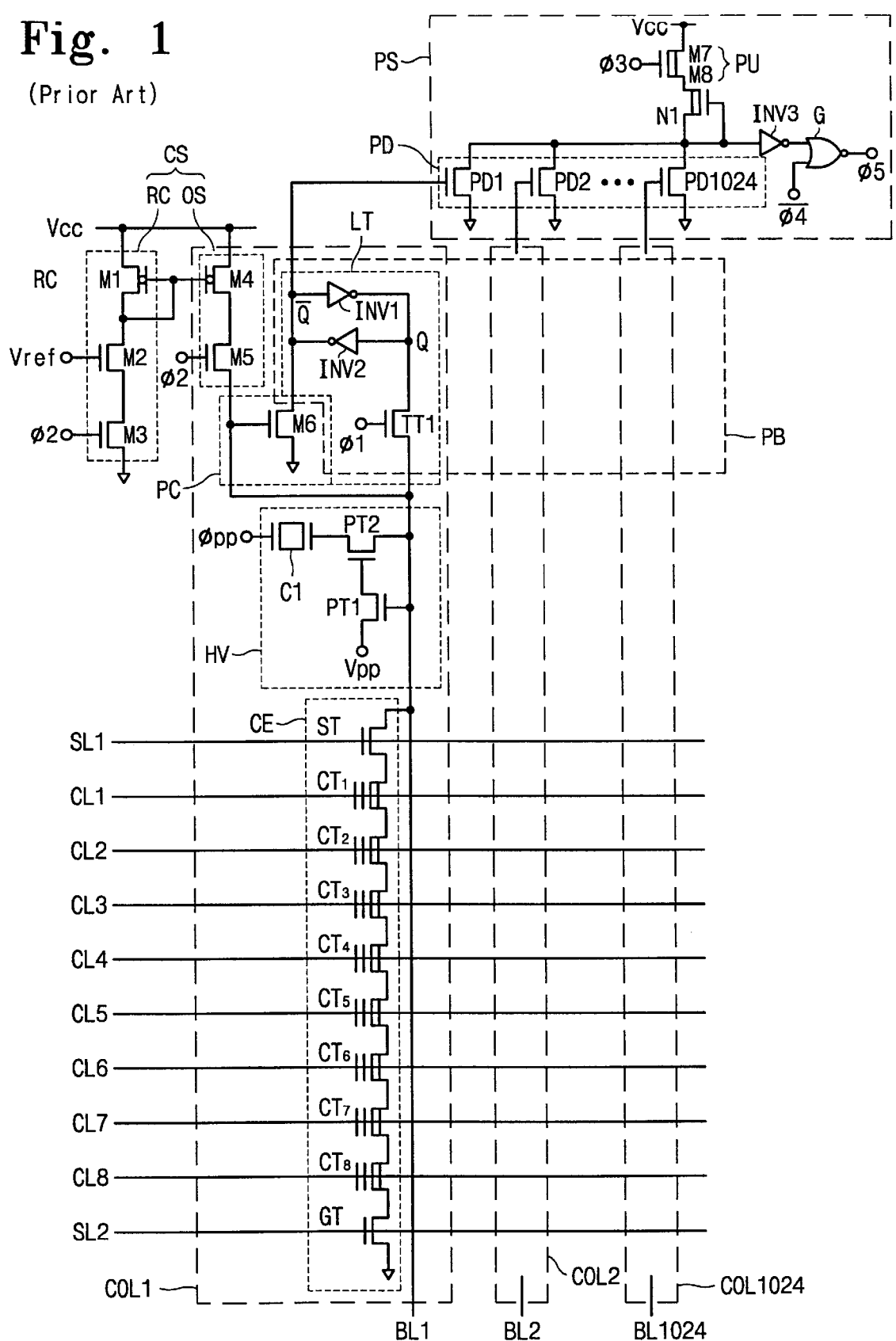
FIG. 1 is a circuit diagram showing a program status detection circuitry of a nonvolatile semiconductor memory device in accordance with a prior art.
Figure 2:
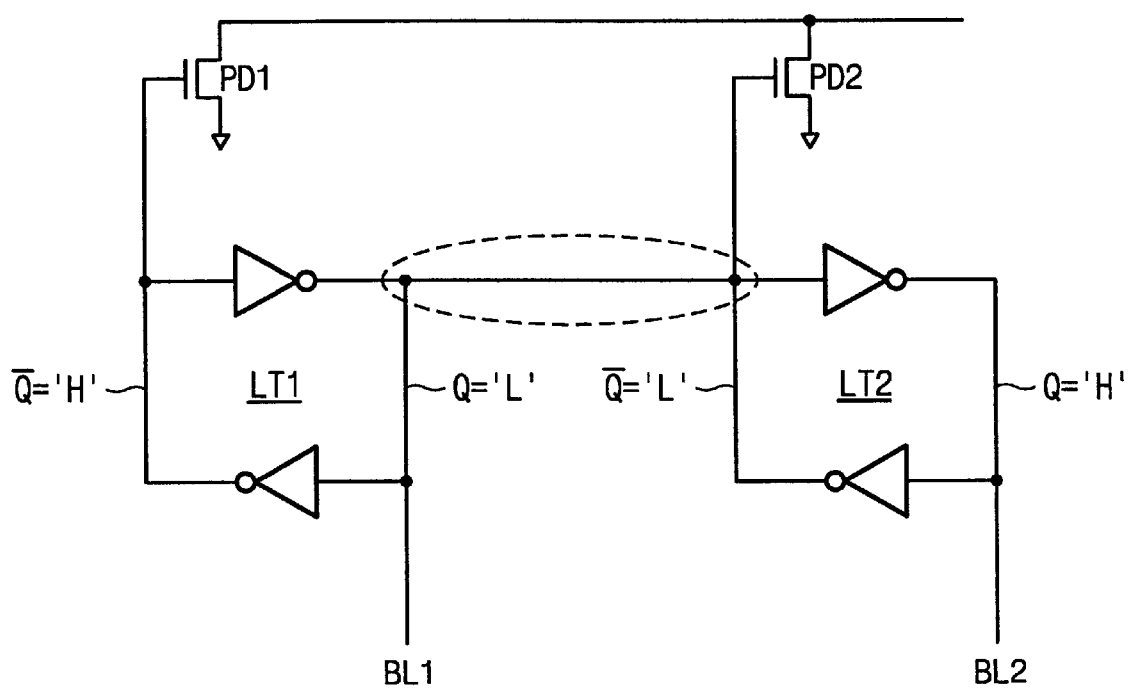
FIG. 2 is a diagram for describing a problem of a prior art.
Figure 3:
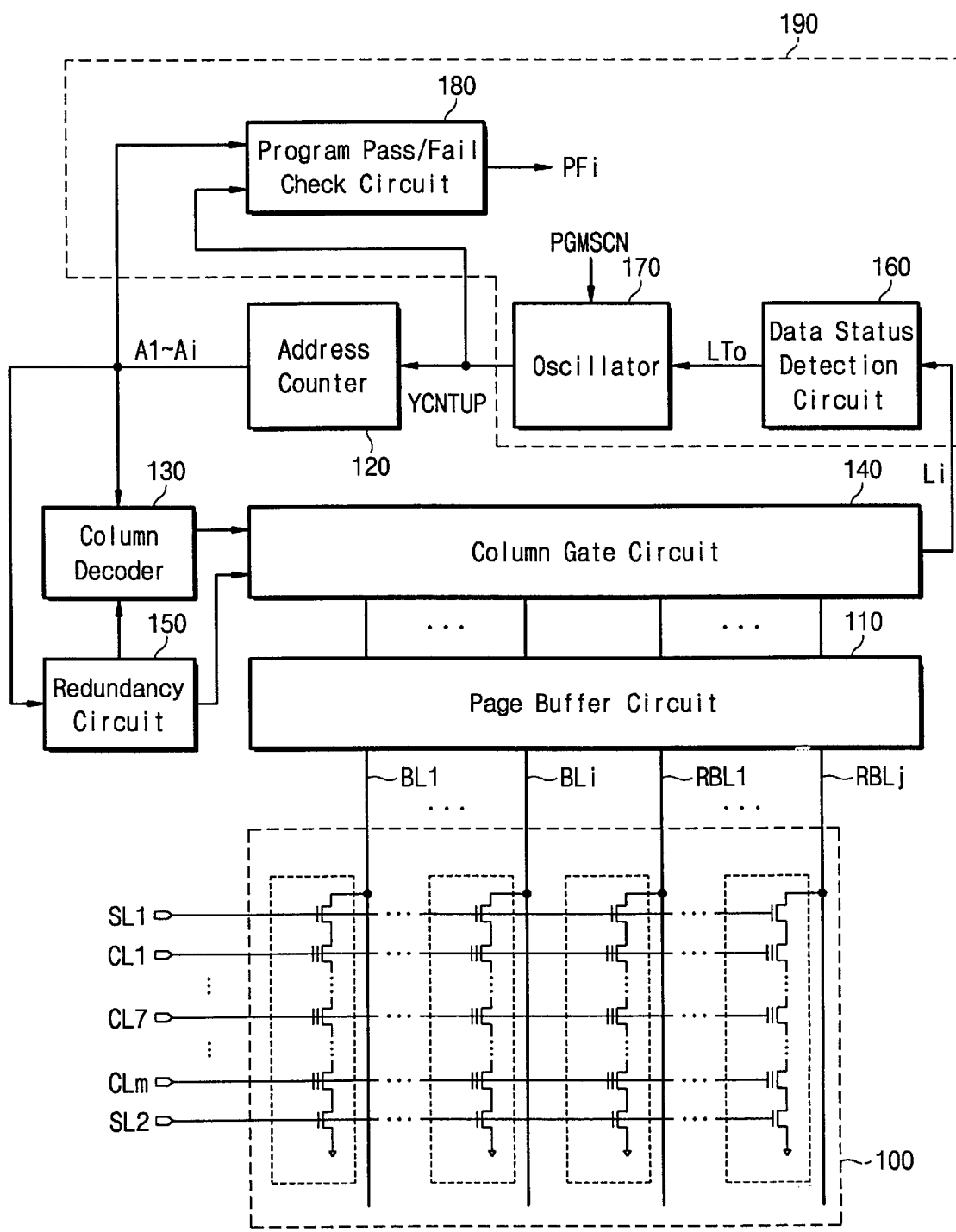
FIG. 3 is a block diagram showing a flash memory device having a program status detection circuit accordance with a first embodiment of the invention.

Referring now to FIG. 3, a nonvolatile semiconductor memory device, i.e., NAND-type flash memory device includes a memory cell array 100 for storing information. In the NAND-type flash memory device, a plurality of bitlines BL1–BLi (i is a positive integer) and a plurality of redundant bitlines RBL1–RBLj (j is a positive integer) are arranged to a column direction through the memory cell array 100. The redundant bitlines RBL1–RBLj are used for substituting defective ones of the bitlines BL1–BLi. Cell strings having the same structure as that of FIG. 1 are coupled to the bitlines BL1–BLi and the redundant bitlines RBL1–RBLj, respectively. A page buffer circuit 110 to which the bitlines BL1–BLi and the redundant bitlines RBL1–RBLj are coupled serves as a driver, which drives bitlines and redundant bitlines RBL1–RBLj during program operation of a program cycle according to a state of data to be programmed. During program verifying operation (specifically, verifying read-out operation) of the program cycle, the page buffer circuit 110 serves as a sense amplifier (or page buffer circuit) which senses data bits programmed to cell transistors coupled to a selected page.

Referring to FIG. 3 again, an address counter 120, a column decoder 130, a column pate circuit 140, a redundancy circuit 150, and a program status detection circuitry 190 are provided to the flash memory device.

The address counter 120 is composed of counters, and generates a column address Ai (i=1–8, in this embodiment)

in response to a count-up signal YCNTUP outputted from the program status detection circuitry 190 during a program verifying operation. The column decoder 130 decodes the column address Ai generated in the address counter 120. The decoded column address is transmitted to the column gate circuit 140. The column gate circuit 140 selects the bitlines BL1–BLi corresponding to the decoded column address, i.e., selects page buffers corresponding to the selected bitlines out of page buffers provided to the page buffer circuit 110. The programmed data bits stored in the selected page buffers (it means that the data bits are read out during the verifying read-out operation after completion of the program operation) are sequentially transmitted to the program status detection circuitry 190 through the column gate circuit 140 during program verifying operation.

The column address generated in the column counter 120 is transmitted to a redundancy circuit 150, as shown in FIG. 3. The redundancy circuit checks whether there is a defective one of the selected bitlines corresponding to the column address. If the selected bitlines includes at least one defective bitline, the redundancy circuit 150 enables the column decoder 130 and makes a redundant bitline corresponding to the defective bitline selected by the column gate circuit 140. That is, if there is a defective one of the columns corresponding to the column address (i.e., redundancy is required), a redundant bitline corresponding to the defective column is selected by the redundancy circuit 150 and the column gate circuit 140 while a bitline corresponding to the defective column is not selected thereby.

During Y-SCAN operation of each program cycle, the programmed data bits held to the selected page buffers are transmitted to the program status detection circuitry 190 through the column gate circuit 140. The program status detection circuitry 190 checks whether all of the transmitted data bits are involved in a required program state. If so, the count-up signal YCNTUP outputted from the program status detection circuitry 190 has high-to-low transition and, therefore, the column address outputted from the address counter 120 increases as much as "1". As the increasing column address is transmitted to the column decoder 130 and the redundancy circuit 150, next columns are selected by the column gate circuit 140. If at least one of the data bits is involved in an insufficiently programmed state, the count-up signal YCNTUP outputted from the program status detection circuitry 190 retains a high level so that the address counter 120 can be disabled (it means that a previously generated column address is held without increasing as much as "1"). In this case, the column decoder 130, the column gate circuit 140, and the redundancy circuit 150 compose a column selection circuit.

Figure 4:
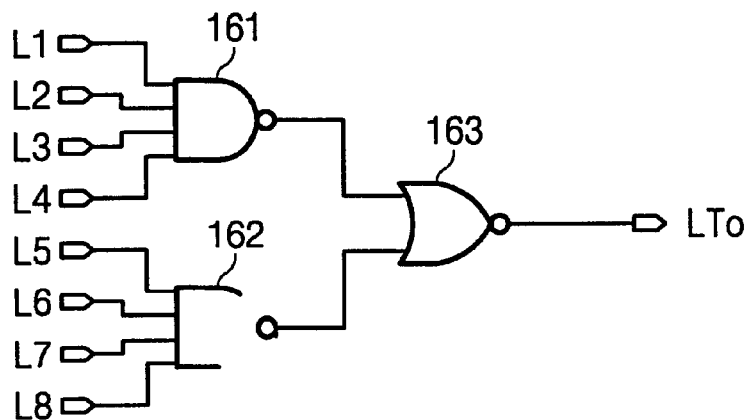
FIG. 4 illustrates a preferred embodiment of a data status detection circuit shown in FIG. 3.
Figure 5:
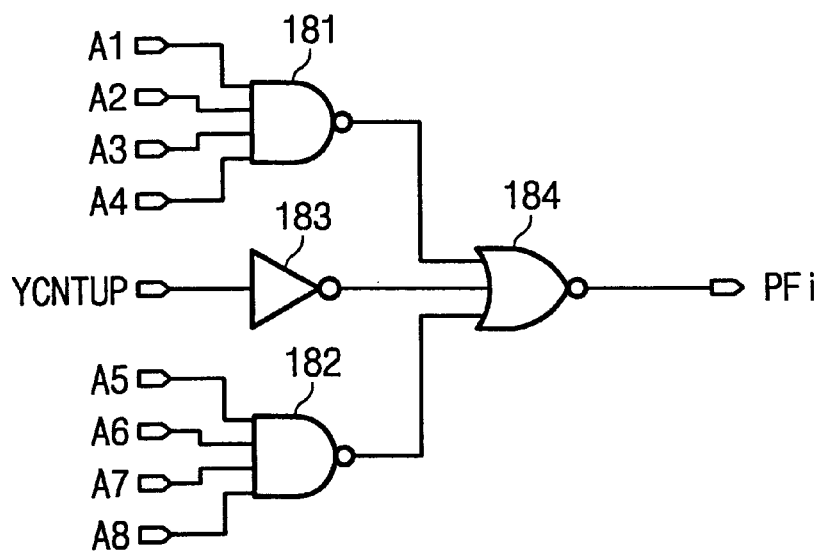
FIG. 5 illustrates a preferred embodiment of a pass/fail check circuit shown in FIG. 3.

Continuously referring to FIG. 3, the program status detection circuitry 190 includes a data state detection circuit 160, an oscillator 170, and a program pass/fail check circuit 180. When byte/word-unit data bits Li transferred from the column gate circuit 140 are involved in a required program state, the data state detection circuit 160 creates an oscillation control signal LTo for operating the oscillator 170. As shown in FIG. 4, the data state detection circuit 160 comprises two NAND-type gates 161 and 162, coupled to each other, and a NOR-type gate 163. When one byte data bits L1–L8 transmitted from the page buffer circuit 110 through the column gate circuit 140 are at a high level (i.e., all the data bits L1–L8 are involved in a program state), the oscillation control signal LTo goes to a high level. If at least one of the data bits is at low level (i.e., at least one of the data bits is involved in an insufficiently programmed state), the oscillation control signal LTo goes to a low level.

Further referring to FIG. 3, the output signal (i.e., count-up signal YCNTUP) of the oscillator 170 transitions from a low level to a high level when a signal PGMSCN informing a program pass/fail check internal is enabled to a high level. According to a state of the oscillation control signal LTo outputted from the data state detection circuit 160, the oscillator 170 outputs the count-up signal YCNTUP that transitions from a high level to a low level. For example, when the data bits L1–L8 transmitted through the column gate circuit 140 is involved in a program state, the oscillation control signal LTo with a high level is generated. The oscillator 170 generates the count-up signal YCNTUP of high-to-low transition so that a column address from the address counter 120 may increase as much as "1".

During the Y-SCAN operation, a program pass/fail check circuit 180 generates a flag signal PFi informing program pass or program fail in response to the column address generated from the address counter 120 and the count-up signal YCNTUP outputted from the oscillator 170. The program pass/fail check signal comprises two NAND-type gates 181 and 182, an inverter 183, and a NOR-type gate 184. The gates 181 and 182 are coupled to each other. When all the bits A1–A8 of the column address are at a low level and the count-up signal YCNTUP is at a high level, the program pass/fail check circuit 180 generates the pass/fail flag signal PFi with a high level. When at least one of the column address bits is at a low level, the circuit 180 generates the flag signal PFi with a low level regardless of the logic state. When the count-up signal YCNTUP is at low level, the circuit 180 generates the flag signal PFi with a low level though all the column address bits are at high level.

The program state detection circuitry 190 checks a program state using programmed data bits transmitted through the column gate circuit 140 along a column address having redundancy information. Substituting for a redundant bitline based on control of the redundancy circuit 150, a defective bitline has no influence upon the circuitry 190. That is, it is possible to overcome the problem that a flash memory device is regarded as a fail device owing to a defective bitline.

Figure 6:
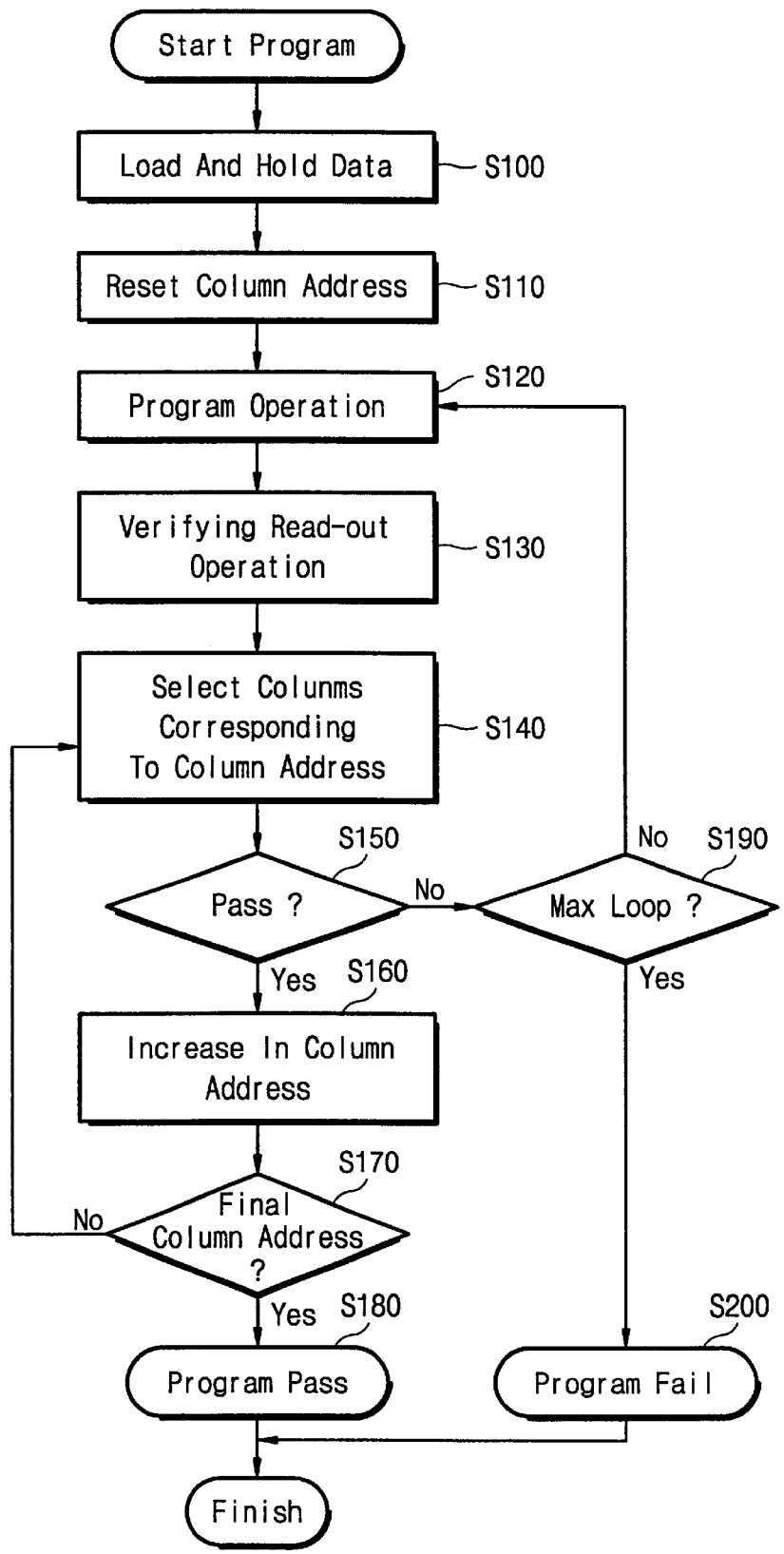
FIG. 6 is a flowchart showing a program algorithm in accordance with a first embodiment of the invention.

FIG. 6 is a flowchart showing a program algorithm in accordance with the present invention. Now, operation of a flash memory device will be described more fully with reference to FIGS. 6–7.

Prior to performing a program, erase operation for converting a threshold voltage of each cell transistor into a negative voltage is carried out, and then the program will be performed according to the program algorithm. In step S100, data that will be programmed is loaded on a page buffer circuit 110. Step S100 proceeds to step S110 wherein a column address is reset. That is, an address counter 120 is reset. Thereafter, a series of program cycles for storing the loaded data in a memory cell array 100 will be carried out as follows. to In step S120, program operation is performed during a predetermined time. Step S120 proceeds to step S130 wherein the page buffer circuit 110 detects and holds data bits which are programmed to memory cells of a selected page. That is, verifying read-out operation is carried out. Thereafter, Y-SCAN operation will be carried out as follows.

Figure 7A:
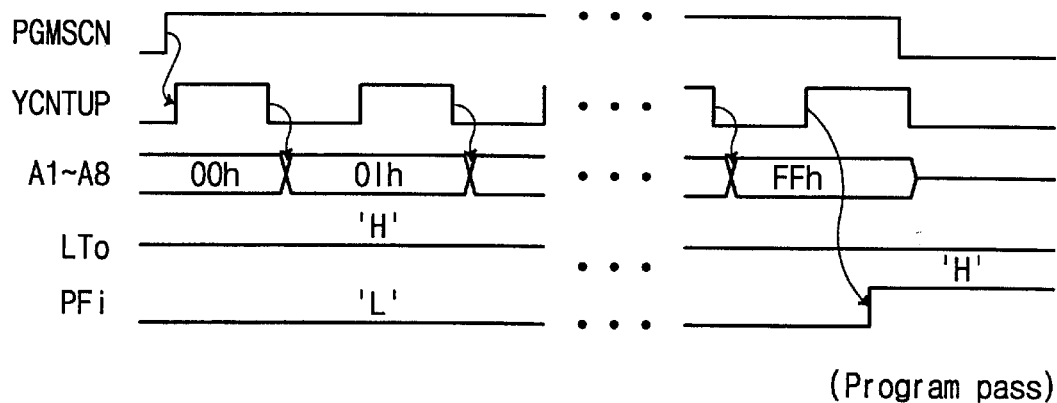
FIGS. 7A–7B timing views for describing Y-SCAN operation in accordance with the invention.

When the Y-SCAN operation starts, a signal informing the Y-SCAN operation transitions from a low level to a high level, as shown in FIG. 7A. In step S110, a column decoder 130 (or redundancy circuit 150) and a column gate circuit 140 select bitlines corresponding to byte-unit columns according to column address bits A1–A8 (e.g., "0"). If the selected columns include one defective column, one redundant bitline and seven bitlines are selected. When the signal PGMSCN transitions from a low level to a high level, a count-up signal YCNTUP outputted from an oscillator 170 of a program status detection circuitry transitions from a low level to a high level.

Programmed byte-unit data bits L1–L8, which are held to page buffers corresponding to the selected columns, are transmitted to a data status detection circuit 160 through a column gate circuit 140. When all the data bits L1–L8 inputted in step S150 are checked to be at a high level, an oscillation control signal LTo outputted from the data status detection circuit 160 retains a high level. Then, the oscillator 170 generates the count-up signal YCNTUP of high-to-low transition in response to the oscillation control signal of a low level.

A program pass/fail check circuit 180 outputs a pass/fail flag signal PFi of a low level because all the column address bits are at a low level. And, an address counter 120 increase a column address as much as "1" in response to the high-to-low transition of the count-up signal YCNTUP (step S160).

In step S170, it is checked whether the increasing column address is the final column address. If not so, a column selection circuitry including a column decoder 130, a redundancy circuit 150, and a column gate circuit 140 selects byte-unit columns in response to the increasing column address. It is understood that, if byte-unit bitlines are selected or there is a defective column, a redundant bitline and normal bitlines can be selected. The programmed data bits L1–L8 are transmitted to the data status detection circuit 160 through the column gate circuit 140. When all the inputted data bits L1–L8 are checked to be at a high level (be involved in a program state), the following operation will be carried out as just the above-mentioned. At this time, the output PFi of the program pass/fail check circuit 180 retains a low level.

When the data bits is always involved in a programmed state, the series of the operations are repeatedly carried out until all the column address bits generated in the address counter 120 go to a high level (i.e., until all the columns are selected). As a result, the pass/fail flag signal PFi outputted from the program pass/fail check circuit 180 transitions from a low level to a high level when all the address bits are at a high level and the count-up signal YCNTUP transitions from a low level to a high level, as shown in FIG. 7A. It means that all cell transistors coupled to the selected page are correctly programmed.

Figure 7B:
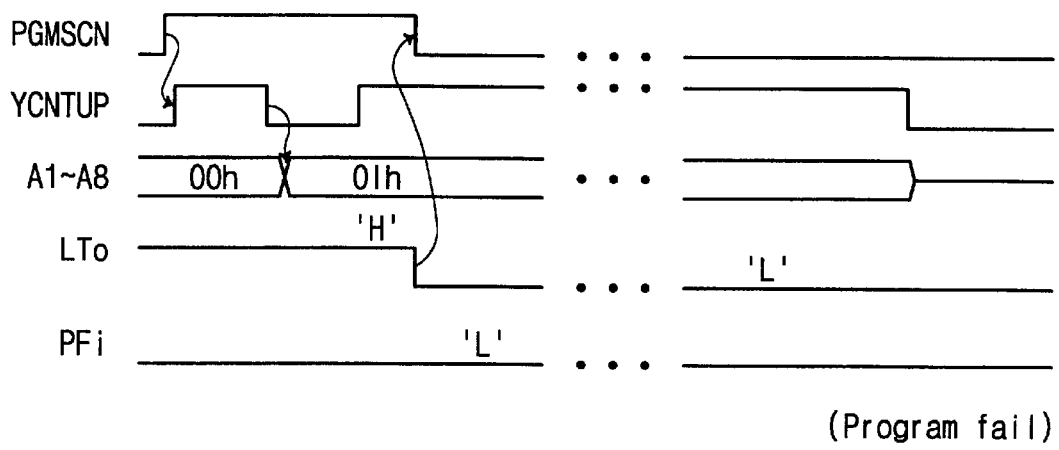

When at least one of the data bits L1–L8 is at a low level before all the column address bits go to a high level (the final column address is generated), the oscillation control signal LTo is disabled from a high level to a low level, as shown in FIG. 7B. This makes the count-up signal YCNTUP generated from the oscillator 170 retain a high level, so that the column address retains the increasing value without increasing a value thereof. And, the signal PCMSCN goes to a low level by high-to-low transition of the oscillation control signal LTo, as shown in FIG. 7A. The program pass/fail check circuit 180 then generates the pass/fail flag signal PFi of a low level because at least one of the column address bits retains a low level. In step S190, it is checked whether a program cycle which is being performed is the final program. If so, the program is finished as program fail. If not so, program operation, verifying read-out operation, and Y-SCAN operation are repeatedly performed according to a program cycle of decided times.

A column address, which assigns memory cells checked to be program fail in YSCAN operation of the former program cycle, is used as a start column address of Y-SCAN operation of the latter program cycle. It means that time required for performing Y-SCAN operation is reduced. As a result, entire program time can be reduced.

According to the program algorithm of the present invention, defective ones of bitlines arranged in a memory cell array 100 are conventionally substituted for redundant bitlines. A defective column is not included in columns that are selected by a column selection circuit (including a column decoder, a redundancy circuit, and a column gate circuit) according to a column address having redundancy information. Data bits for checking program pass/fail are related to normal columns, so that a substituted detective column has no influence upon operation for checking the program pass/fail.

(Second Embodiment)

Figure 8:
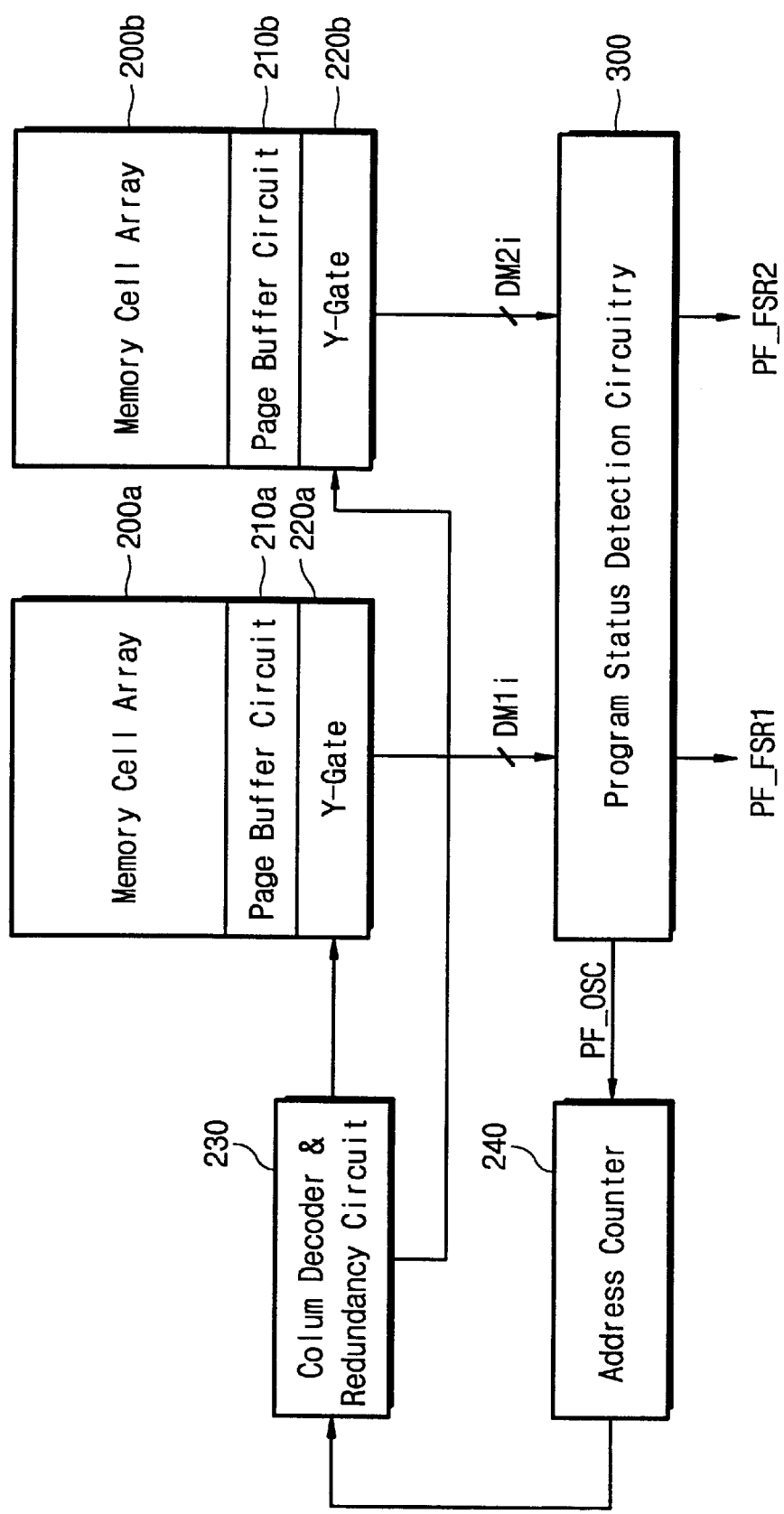
FIG. 8 is a block diagram of a flash memory device having a program status detection circuitry in accordance with a second embodiment of the invention.

FIG. 8 is a block diagram showing a flash memory device in accordance with a second embodiment of the present invention. Referring now to FIG. 8, the flash memory device includes two memory cell arrays 200a and 200b. Each of the cell arrays 200a and 200b is structured the same as shown in FIG. 3, and has additional rows (word lines) and columns (bitlines). And, each of them is called a "mat". The flash memory device further includes ) page buffer circuits 210a/210b and column gate circuits 220a/220b which correspond to the cell arrays 200a and 200b, respectively. A column decoder & redundancy circuit 230 and an address counter 240 are provided to the flash memory device. The page buffer circuits 210a and 210b, the column gate circuits 220a and 220b, the column decoder & redundancy circuit 230, and the address counter 240 has the same structure and function as shown in FIG. 3. Therefore, description thereof will be skipped herein.

The flash memory device supports a function to simultaneously program two memory cell arrays 200a and 200b. Hereafter, this function is referred to as "1K program". The device includes a program status detection circuitry 300, receives data DM1i and DM2i (i is a positive integer) transmitted through the column gate circuits 220a and 220b, and checks whether each of the data DM1i and DM2i is involved in a program status.

Conventionally, defective ones of bitlines arranged in the memory cell arrays 200a and 200b are substituted for redundant bitlines. A defective column is not included in columns which are selected through the column decoder & redundancy circuit 230 and the column gate circuit 220a and 220b according to a column address having redundancy information. Data bits, which are transmitted from the page buffer circuit 210a and 210b through the column gate circuit 220a and 220b to the program status detection circuitry 300 so as to check program pass/fail, are related to normal columns which are not defective.

Accordingly, a substituted defective column cannot have an influence upon operation for checking program pass/fail, thereby solving the above-mentioned problems.

Continuously referring to FIG. 8, the program status detection circuitry 300 checks whether the data bits DM1i transmitted through the column gate circuit 220a corresponding to the memory cell array 200a are involved in a program status (e.g., "1"). And, the circuitry 300 checks whether the data bits DM2i transmitted through the column gate circuit 200b corresponding to the memory cell array 220b are involved in a program status (e.g., "1"). As a check result, the circuitry 300 outputs signals PF_OSC, PF_FSR, and PF_FSR2. This will be described more fully hereinafter.

Figure 9:
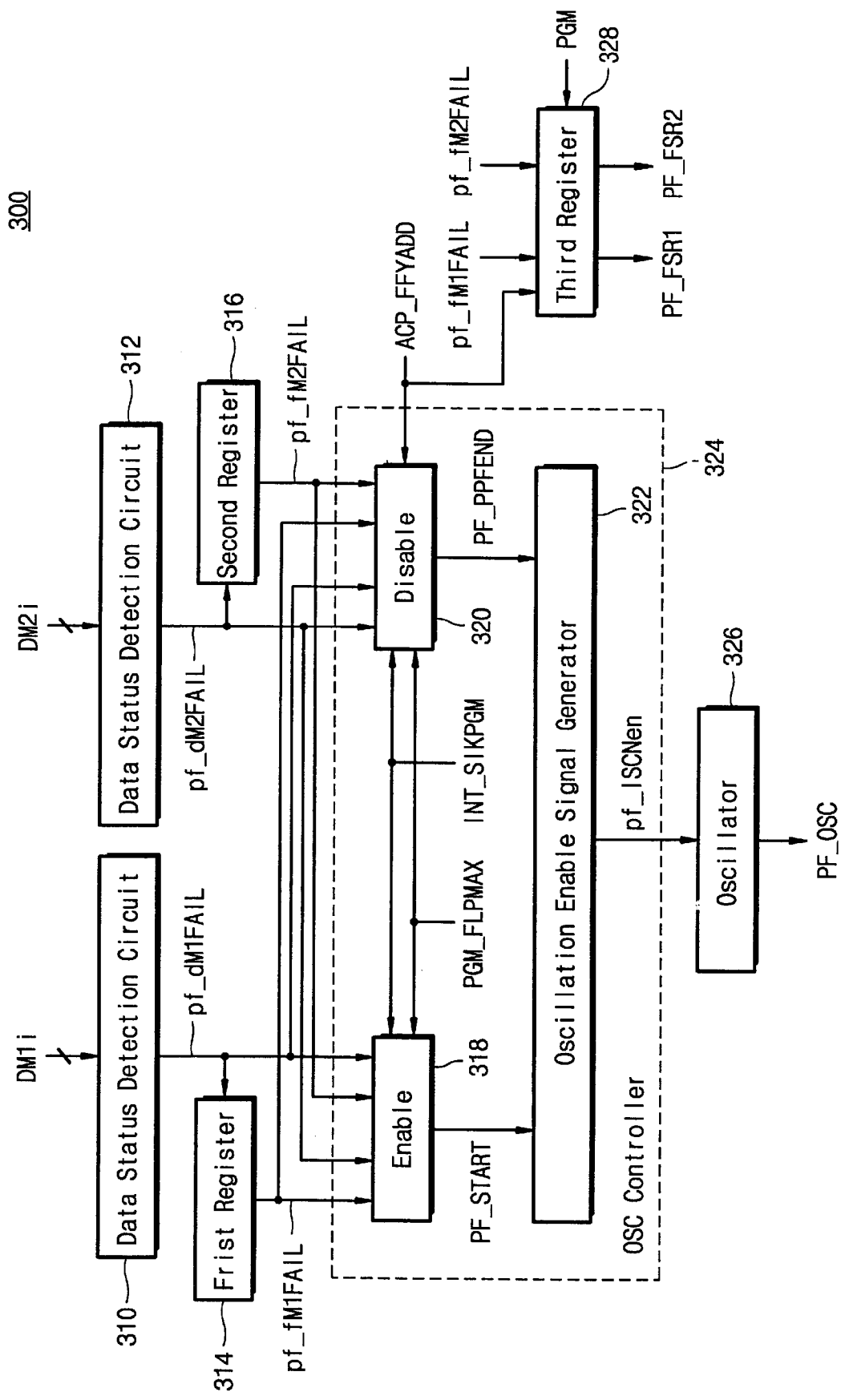
FIG. 9 is a block diagram showing a program status detection circuitry shown in FIG. 8.

Referring to FIG. 9 wherein a block diagram shows a program pass/fail check circuit in accordance with the second embodiment of the present invention, the program status detection circuitry 300 includes two data status detection circuit 310 and 312, a first to third registers 314, 316, and 328, an oscillator controller 324, and an oscillator 326.

The data status detection circuits 310 and 312 correspond to the memory cell arrays 200a and 200b, respectively. The circuit 310 checks whether all data bits DM1i (e.g., byte-unit data bits), which are transmitted through the column gate circuit 220a among data bits read out from the corresponding memory cell array 200a, are involved in a program state. As a checking result, the circuitry 300 outputs a signal pf_dM1FAIL. Similar to this, the data status detection circuit 312 checks whether all data bits DM2i (e.g., byte-unit data bits), which are transmitted through the column gate circuit 22b among data bits read out from the corresponding memory cell array 200b, are involved in a program status. As a checking result, the circuitry 300 outputs a signal pf_dM2FALL.

Figure 10:
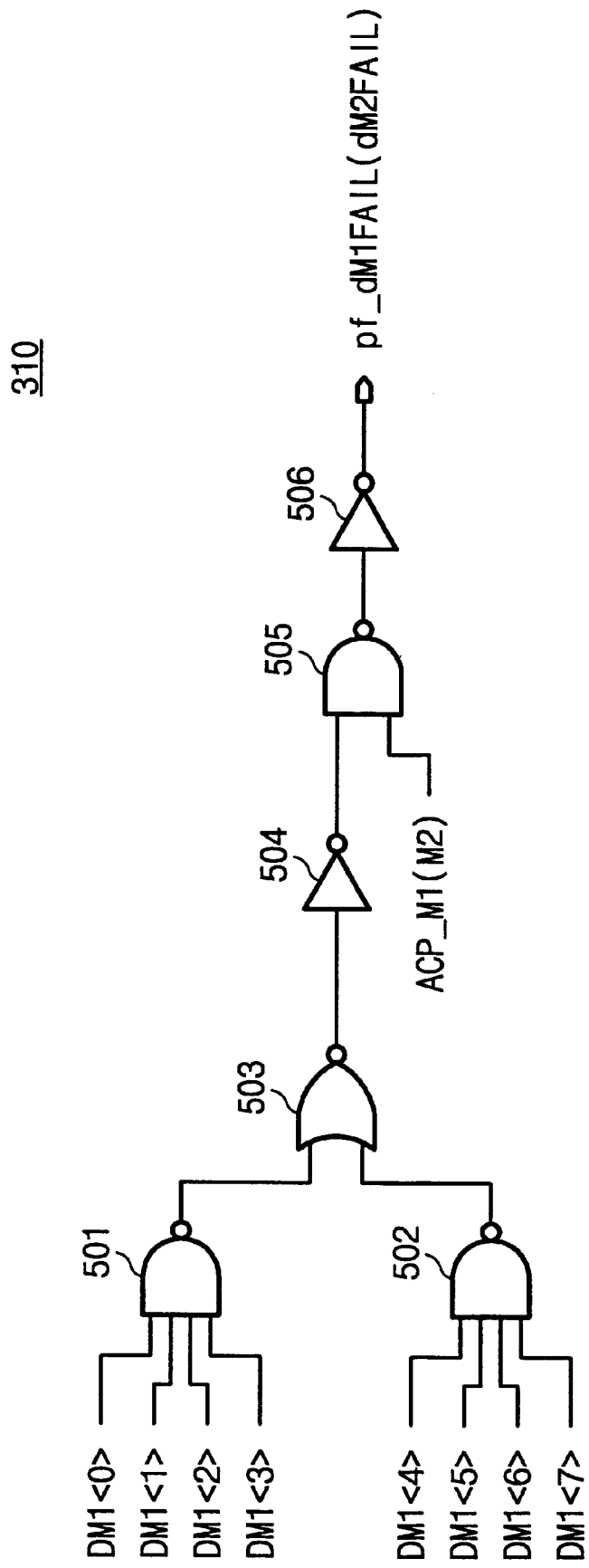
FIG. 10 illustrates a preferred embodiment of a data status detection circuitry shown in FIG. 9.

Referring to FIG. 10 showing a preferred embodiment of the data status detection circuit 310, the circuit 310 is composed of three NAND-type gates 501, 502, and 503, a NOR-type gate 503, and two inverters 504 and 506. A signal ACP_M1 indicates whether a memory cell array 200a is selected. If so, the signal ACP_M1 has a high level. If all data bits DM1<1> through DM1<7> are at a logic "1" (are involved in a program status), the signal pf_dMFAIL goes to a high level. It means that cell transistors corresponding to selected columns are programmed with a threshold voltage corresponding to a required program status. If at least one of the data bits DM1<0>through DM1<7>is at logic "0", the signal pf_dM1FAIL goes to a low level. It means that the cell transistors corresponding to the selected columns are insufficiently programmed. Although not shown in a figure, it is understood that a data state detection circuit 312 corresponding to the memory cell array 200b has the same structure as shown in FIG. 10.

Referring to FIG. 9 again, the first and second registers 314 and 316 store the signals pf_dM1FAIL and pf_dM2FAIL outputted from the data status detection circuits 310 and 312 during the final program cycle, respectively. In the final program cycle, the registers 314 and 316 output signals pf_fM1FAIL/pf_fM2FAIL in response to the signal pf_dM1FAIL and pf_dM2FAIL outputted from the data status detection circuits 310 and 312, respectively. A preferred embodiment of the first register 314 corresponding to the data status detection circuit 310 is shown in FIG. 11.

Figure 11:
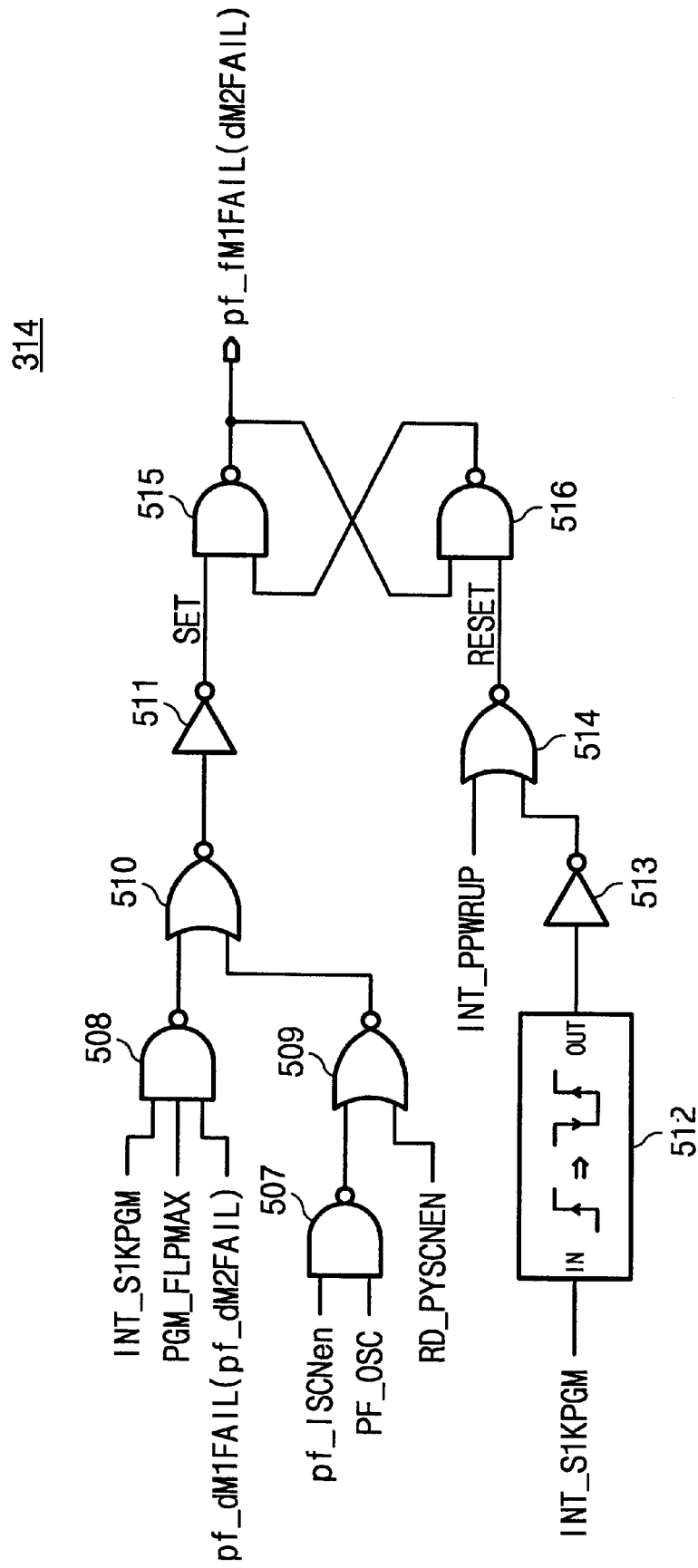
FIG. 11 illustrates a preferred embodiment of a first register shown in FIG. 9.

Referring to FIG. 11, the first register 314 is composed of an AND-type gate 507, three NAND-type gates 508, 515, and 516, two inverters 511 and 514, three NOR-type gates 509, 510, and 514, and a pulse generator 512. The NAND-type gates are operated by a setreset flipflop (SR flipflop). Signals INT_S1KPGM and PGM_FLPMAX indicate 1K program operation and a final program cycle, respectively. A signal RD_PYSCNEN indicates start of Y-SCAN operation, as a pulse signal. A signal INT_PPWRUP is enabled in power-up operation. And, a signal pf_ISCNen is supplied from an oscillator controller 324. Each of them is an active high signal.

In the power-up operation or requisition of the 1K program, the first register 314 is initialized to make an output signal pf_fM1FAIL of the SR flipflop go to a low level. If a program cycle which is being performed is not final (i.e., the signal PGM_FLPMAX is at low level), the signal pf_FM1FAIL retains an initialized level (low level). This is because one input SET of the NAND-type gate 515 retains a high level. Consequently, if the cycle is not final, the signal pf_fM1FAIL retains an initialized level irrespective of the output signal pf_dM1FAIL of the data status detection circuit 310. If the cycle is final, the signal PGM_FLPMAX transitions from a low level to a high level. Therefore, the signal pf_fM1FAIL is affected by the signal pf_dM1FAIL outputted from the corresponding data status detection circuit 310. When, for example, the output signal pf_dM1FAIL/pf_dM2FAIL of the data status detection circuit 310/312 is at a low level (i.e., at least one of cell transistors corresponding to selected columns is insufficiently programmed), the input signal SET of the NAND-type gate 505 transitions from a high level to a low level. This causes low-to-high transition of the output signal pf_fM1FAIL/pf_M2FAIL of the register 314/316.

It is understood that the second register 316 corresponding to the data status detection circuit 312 has the same structure as shown in FIG. 11. Accordingly, description thereof will be skipped herein. When the 1K program is carried out and the present program cycle is final, the first and second registers 314 and 316 are affected by the output signals pf_DMLFAIL and pf_dM2FAIL, respectively.

Referring to FIG. 9 again, the oscillator 324 is composed of an enable signal 318, a disable circuit 320, and an oscillation control signal generator 322. The oscillation control signal generator 322 enables an oscillation control signal pf_1SCNen in response to an enable signal PF_START outputted from the enable circuit 318, and disables the signal pf_SCNen in response to a disable signal PF_PPFEND outputted from the disable circuit 320.

Figure 12:
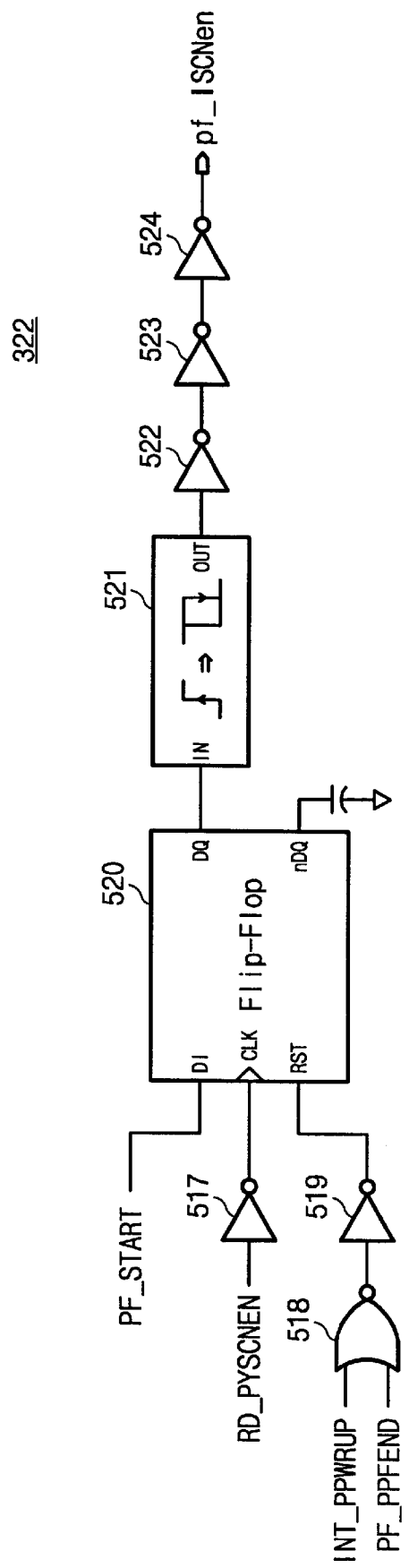
FIG. 12 illustrates a preferred embodiment of an oscillation control signal generator shown in FIG. 9.

Referring to FIG. 12 wherein a preferred embodiment of the oscillation control signal generator 322 is shown, the generator 322 is composed of five inverters 517, 519, 522, 523, and 524, a NOR-type gate 518, a flipflop 520, and a delay circuit 521. The flipflop 520 serves as a latch, and is initialized in power-up operation. And, the flipflop 520 is synchronized with high-to-low transition of a clock signal RD_PYSCNEN to hold the enable signal PF_START outputted from the enable circuit 318. If the enable signal PF_START is at a high level, the oscillation control signal pf_SCNen transitions from a low level to a high level. Thus, the oscillator 326 generates an oscillation signal PF_OSC having a predetermined period. If the enable signal PF_START is at a low level, the oscillation control signal pf_1SCNen continuously retains an initial state of a low level. Thus, oscillator 326 is not operated. Moreover, the flipflop 520 is initialized in low-to-high transition of the disable signal PF_PPFEND outputted from the disable circuit 320. The delay circuit 521 serves as an inverter, and delays low-to-high transition of an input signal D1 during a predetermined time. On the contrary, the delay circuit 521 does not delay high-to-low transition thereof.

Figure 13:
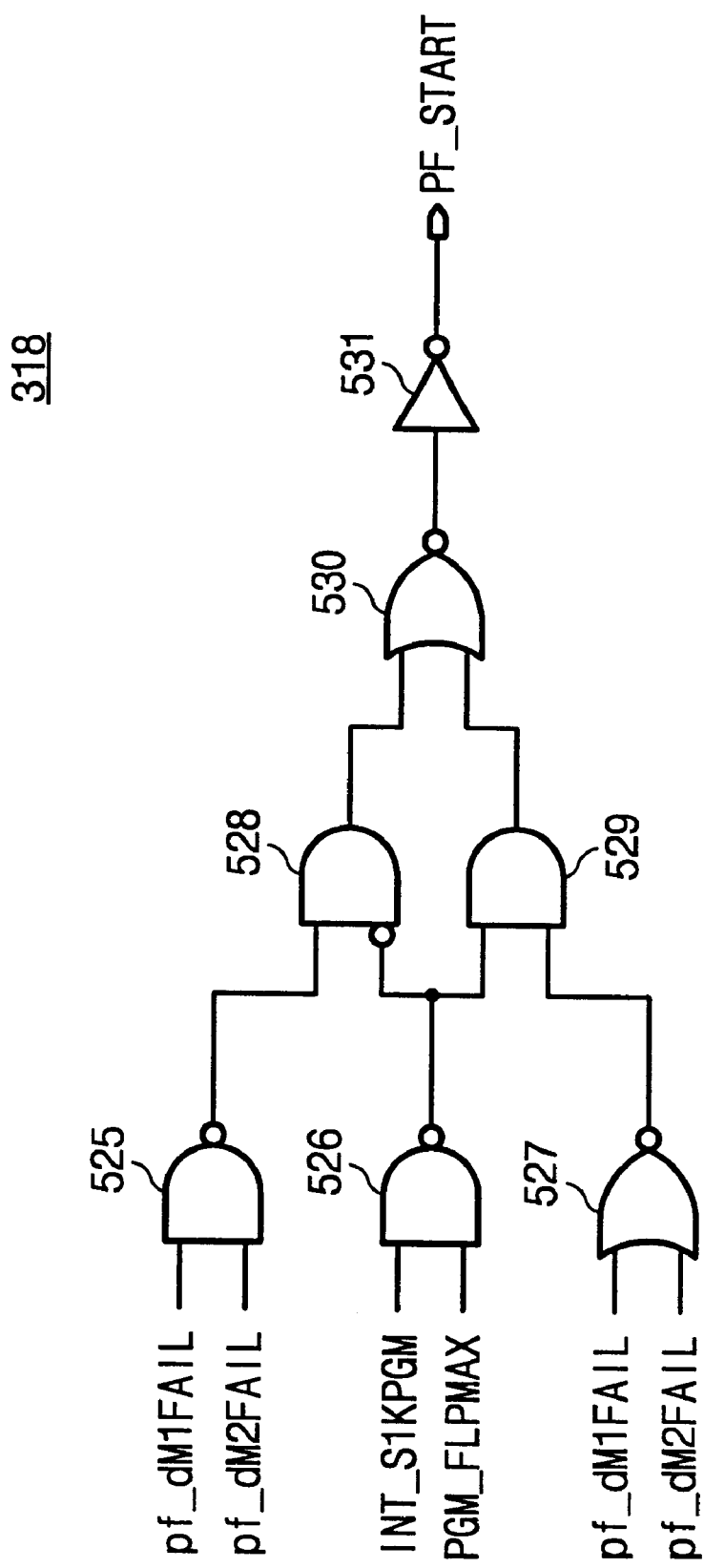
FIG. 13 illustrates a preferred embodiment of an enable circuit shown in FIG. 9.

Referring to FIG. 13 wherein a preferred embodiment of the enable circuit 318 is shown, the circuit 318 is composed of two NAND-type gates 525 and 526, two NOR-type gates 527 and 530, two AND-type gate 528 and 529, and an inverter 531. If a program cycle which is being performed is not final (INT_S1KPGM="H", PGM_FLPMAX="L"), the enable circuit 318 generates an enable signal PF_START of a low or high level in response to signals pf_dM1FAIL and pf_dM2FAIL outputted from the data status detection circuits 310 and 312. If, for example, at least one of the signals pf_dM1FAIL and pf_dM2FAIL is at a high level (program fail to selected data), the enable signal PF_START goes to a low level. This makes an oscillation control signal pf_1SCNen retain a low level, so that an oscillation signal PF_OSC is not generated from the oscillator 326 (Y-SCAN operation is not carried out). If both the signals pf_dM1FAIL and pf_dM2FAIL are at low level (program pass to the selected data), the enable signal PF_START goes to a high level. This makes the oscillation control signal pf_1SCNen go to a high level, so that the oscillator 326 outputs an oscillation signal PF_OSC having a predetermined period.

If a program cycle which is being performed is final, the enable signal PF_START goes to a high level when at least one of the signals pf_dM1FAIL and pf_dM2FAIL is at a low level (program pass to the selected data or memory cell array corresponding thereto). This makes the oscillation control signal pf_1SCNen go to a high level, so that the oscillator 326 outputs the oscillation signal PF_OSC having a predetermined period. When all the signals pf_dM1FAIL and pf_dM2FAIL are at a high level, the enable signal PF_START goes to a low level. This makes oscillation control signal pf_1SCNen retain a low level, so that the oscillator 326 does not generate the oscillation signal PF_OSC (Y-SCAN operation is not carried out).

Figure 14:
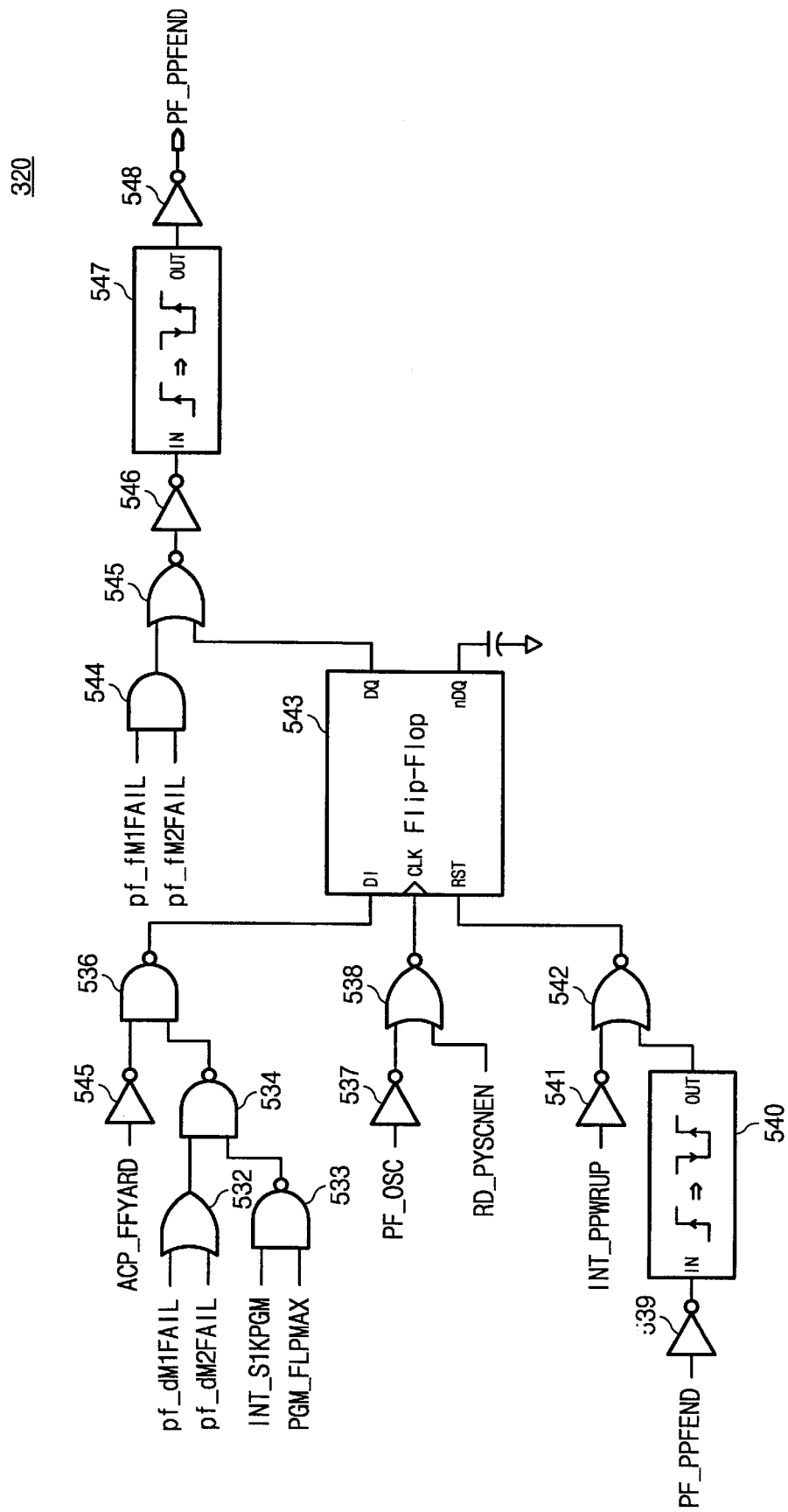
FIG. 14 illustrates a preferred embodiment of a disable circuit shown in FIG. 9.

Referring to FIG. 14 wherein a preferred embodiment of the disable circuit 320 is shown, the circuit 320 is composed of NAND-type gates 533, 534, 536, 542, NOR-type gates 538 and 545, an OR-type gate 532, an AND-type 544, inverters 537, 539, 541, 545, 546, and 548, pulse generators 540, 547, and a flipflop 543. When an input signal transitions from a low level to a high level, each of the pulse generators 540 and 547 generates a signal of an active low pulse.

In power-up operation or high-to-low transition of a disable signal PF_PPFEND, the flipflop 543 is initialized. In response to an output signal of the NOR-type gate 538 which receives an oscillation signal PF_OSC through a signal RD_PYSCNEN and the inverter 537 (i.e., when the oscillation signal PF_OSC transitions from a low level to a high level), the initialized flipflop 543 holds an output signal of the NOR-type gate 536.

If a program cycle which is being performed is not final (all signals PGM_FLPMAX, pf_fM1FAIL, and pf_fM2FAIL retain a low level), an output signal of the NAND-type gate 536 goes to a high level irrespective of a signal ACP_FFYADD when at least one of the signals pf_dM1FAIL and pf_dM2FAIL outputted from the data status detection circuits 310 and 312 are at a high level (program fail to selected data). This generates a disable signal PF_PPFEND of an active high pulse. Consequently, as mentioned above, the oscillation control signal pf_1SCNen is disabled to a low level by the disable signal PF_PPFEND of an active high pulse. When a final column address is created from the address counter 240, a signal ACP_FFYADD transitions from a low level to a high level. If the program cycle which is being performed is final (PGM_FLPMAX="1"), a logic level of a signal outputted from the NAND-type gate 536 is decided by the signal ACP_FFYADD irrespective of the output signals pf_DM1FAIL and pf_dM2FAIL. When the signal ACP_FFYADD is at a low level (the final column address is not created), the output signal of the NAND-type gate 536 goes to a low level. Under this condition, when all output signals pf_fM1FAIL and pf_fM2FAIL are at a low level (data DM1*i* and DM2*i* transmitted through the column gate circuits 220*a* and 220*b* are involved in a program state), the disable signal PF_PPFEND continuously retains a low level. This makes the oscillation control signal pf_1SCNen continuously retain a high level. When at least one of the output signals pf_fM1FAIL and pf_fM2FAIL is at a high level, a disable signal PF_PPFEND of an active high pulse is generated to disable the oscillation control signal pf_1SCNen to a low level.

Referring to FIG. 9 again, the program status detection circuit 300 further includes a third register 328, and outputs flag signals PF_FSR1 and PF_FSR2 which indicate program pass/fail to each of the memory cell arrays 200*a* and 200*b*. Each of the signals PF_FSR1 and PF_FSR2 is set to a high level indicating program fail by an instruction signal PGM. After starting the 1K program, if a program cycle which is being performed is not final, the signals PF_FSR1 and PF_FSR2 are affected by the signal ACP_FFYADD. If final, the flag signals PF_FSR1 and PF_FSR2 are affected by the signals ACP_FFYADD and pf_fM1FAIL, and pf_FM2FAIL. This will be described more fully in later.

According to the above-described flash memory device of the second embodiment, if program fail is created to memory cells of columns selected in one of the memory cell arrays prior to the final program cycle, Y-SCAN operation to the memory cell arrays 200*a* and 200*b* is stopped and then next program cycle is carried out. It is considerable that a column address (assigning insufficiently programmed cells) finally used in Y-SCAN operation in a prior program cycle is used as a start column address of Y-SCAN operation in the next program cycle. Although program fail is created in one of the memory cell arrays 200*a* and 200*b* while carrying out the final program cycle, the Y-SCAN operation is not stopped to confirm program pass/fail to another. That is, a column address is continuously created.

Figure 15:
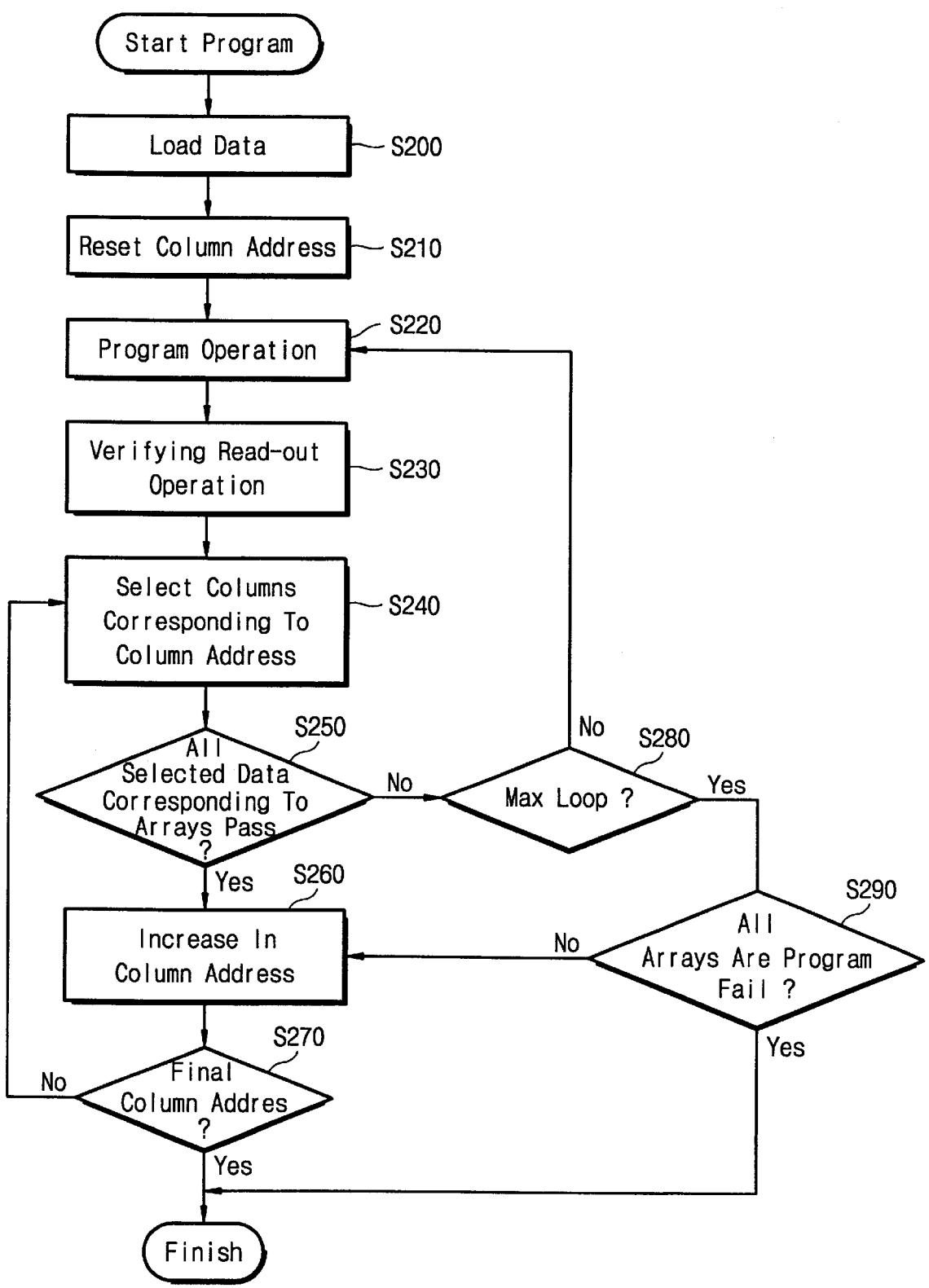
FIG. 15 is a flowchart showing a program algorithm in accordance with a second embodiment of the invention.

FIG. 15 is a flowchart showing a program algorithm in accordance with a second embodiment of the present invention. Now, operation of the flash memory device will be described more fully hereinafter with reference to FIGS. 15–16.

As described above, after carrying out erase operation for converting a threshold voltage of all cell transistors into a negative voltage prior to program performing, As described above, before carrying out a program, erase operation is performed to convert a threshold voltage of all cell transistors into a negative voltage. And then, 1K program (it means that memory cell arrays 200*a* and 200*b* are simultaneously performed) will be performed according to a program algorithm shown in FIG. 6. If the 1K program starts, a third register 328 of the program status detection circuitry 300 is initialized. That is, flag signals PF_FSR1 and PF_FSR2 are initialized to a high level (program fail), respectively. A disable signal PF_PPFEND and an oscillation control pf_1SCNen are also initialized to a low level. Data which will be programmed is loaded on the page buffer circuits 210*a* and 210*b*, respectively. In step S210, the address counter 240 is reset. Thereafter, a program cycle (program operation, verifying read-out operation, and Y-SCAN operation) for storing the loaded data in the memory cell arrays 200*a* and 200*b* is carried out as follows. In step S220, 1K program operation to the loaded data is performed with the same method as mentioned above. Step S220 proceeds to step S230 wherein a page buffer circuits 210*a* and 210*b* detects and holds data bits programmed to memory cells corresponding to a selected page of the memory cell arrays 200*a* and 200*b*. That is, verifying read-out operation is performed. Thereafter, Y-SCAN operation is performed as follows.

Figure 16A:
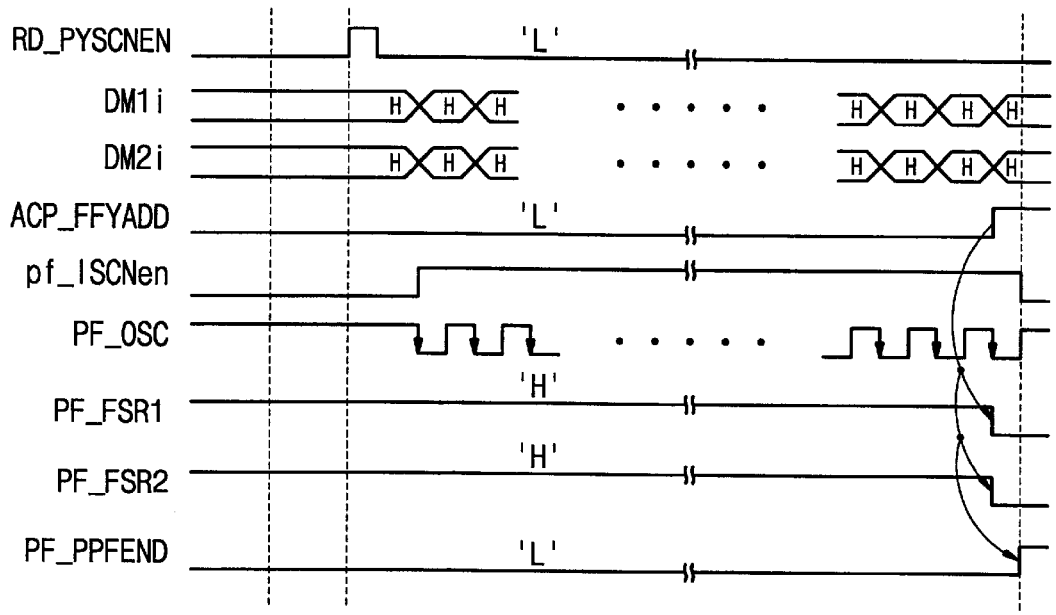
FIGS. 16A–16D are timing views for describing Y-SCAN operation in accordance with the invention.

As shown in FIG. 16A, if the Y-CAN operation starts, a pulse-shaped signal RD_PYSCNEN for informing start of the Y-SCAN operation is generated. Among columns of each of the memory cell arrays 200a and 200b, byte-unit columns (page buffers corresponding to bitlines or columns) are selected by the column decoder & redundancy circuit 230 and the column pass gate circuits 220a and 220b according to a column address which is formerly initialized. If the selected columns corresponding to each of the memory cell arrays 200a and 200b include one defective column, one redundant bitline and seven bitlines per one memory cell array will be selected (step S240). The data (hereafter, DM1$i$ and DM2$i$ are referred to as first data and second data, respectively), which are held to page buffers of selected columns corresponding to each of the memory cell arrays 200a and 200b, are transmitted to the corresponding data status detection circuits 310 and 312, respectively.

In step S250, it is checked whether all bits of the first and second data DM1$i$ and DM2$i$ are involved in a program state (logic "1"). If so, each of the signals pf_dM1FAIL and pf_dM2FAIL goes to a low level indicating the fact that the selected data are correctly programmed. If the enable signal PF_START is at a high level, the data DM1$i$ and DM2$i$ are held to a flipflop 520 of the oscillation control signal generator 322 in high-to-low transition of a signal RD_PYSCNEN. Thus, the oscillation control signal pf_1SCNen transitions from a low level to a high level so as to operate the oscillator 326. In high-to-low transition of an pscillation signal PF_OSC, the address counter 240 increase a column address as much as "1" so as to select next columns (step S260).

In step S270, it is checked whether a column address outputted from the address counter 240 is final. If not so, the foregoing steps (S240, S250, and S260) are repeatedly carried out until all columns are selected (i.e., a final column is created). If so, a signal ACP_FFYADD transitions from a low level to a high level. Consequently, all the flag signals PF_FSR1 and PF_FSR2 outputted from the third register 328 go to a low level (program fail). Thereafter, as shown in FIG. 16A, the disable signal PF_PPFEND and oscillation control signal pf_1SCNen are sequentially disabled according to low-to-high transition of a signal ACP_FFYADD.

Figure 16B:
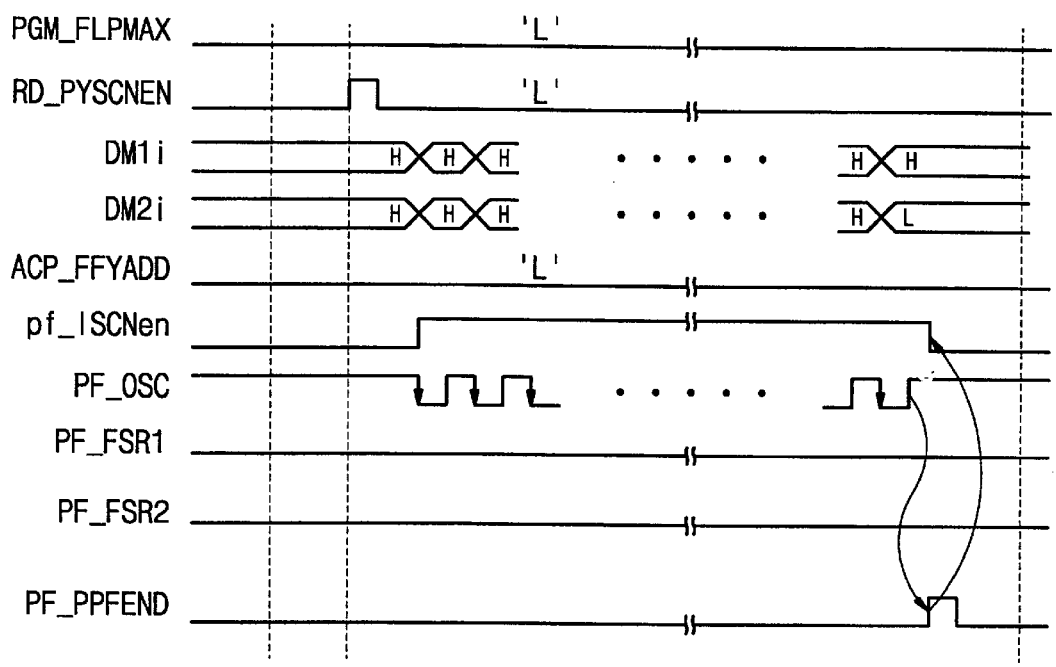

Referring to FIG. 16B, while Y-SCAN operation of any program cycle is carried out (or a signal PGM_FLPMAX retains a low level), the first and second data DM1$i$ and DM2$i$ are transmitted to the data status detection circuits 310 and 312, respectively. When one of the data DM1$i$ and DM2$i$ (e.g., the second data DM2$i$) is checked to be insufficiently programmed (step S250), an output signal pf_dM2FAIL of the data status detection circuit 312 corresponding to the second data DM2$i$ transitions from a low level to a high level. Because a program cycle which is being performed is not final (i.e., the signal PGM_FLPMAX retains a low level), an input signal ID of the flipflop 543 of the disable circuit 320 (i.e., an output signal of the NAND-type gate 536) transitions from a low level to a high level. Consequently, as shown in FIG. 16B, the disable circuit 320 generates a disable signal PF_PPFEND of an active high pulse. This leads to high-to-low transition of the oscillation control signal pf_1SCNen. The Y-SCAN operation of the program cycle is finished through the foregoing procedure.

Figure 16C:
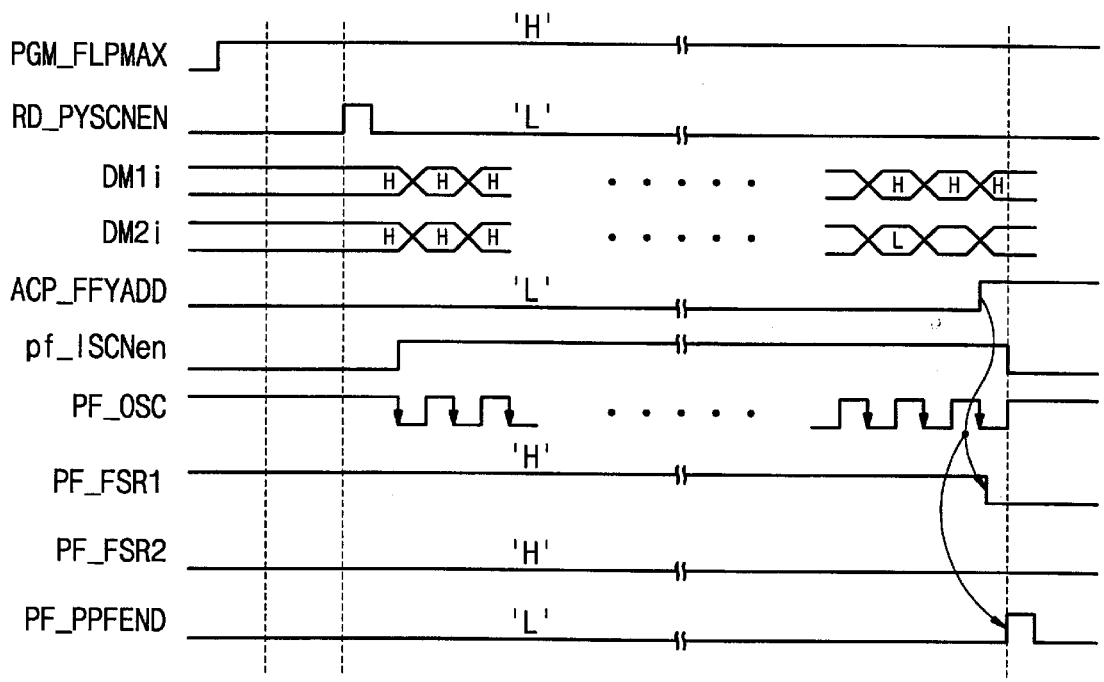

Referring to FIG. 16C, when one of the first and second data DM1$i$ and DM2$i$ (e.g., the second data DM2$i$) is checked to be insufficiently programmed (step S250) while a signal PGM_FLPMAX retains a high level (i.e., Y-SCAN operation of the final program cycle is carried out), an output signal pf_dM2FAIL of the data status detection circuit 312 goes to a high level. Because a program cycle which is being performed is final, the signal pf_dM2FAIL of a high level is stored in the second register 316. Similarly, the signal pf_dM1FAIL of a low level is stored in the first register 314. As a result, an output signal pf_fM1FAIL of the first register 314 retains a low level while an output signal pf_fM2FAIL of the second register 316 transitions from a low level to a high level. Although a signal pf_dM2FAIL goes to a high level, a disable signal PF_PPFEND continuously retains a low level. This is because the program cycle which is being performed is final and the signal ACP_FFYADD is at a low level. Therefore, the disable signal PF_PPFEND retains a low level because one of the input signals pf_fM1FAIL and pf_fM2FAIL is at a high level. Although the memory cell array is checked to be program fail (step S290), the address counter 240 increases in a column address as much as "1" in response to high-to-low transition of an oscillation signal PF_OSC so as to select next columns of the memory cell array 200a. Afterwards, the above-described steps are repeatedly carried out until the final column address is created. When the final column address is created (i.e., the signal ACP_PFFYADD transitions from a high level to a low level), the disable circuit 320 generates a pulse-shaped disable signal PF_PPFEND. Consequently, the oscillation control signal pf_1SCNen is disabled to a low level so as not to operate the oscillator 326.

When the signal ACP_FFYADD transitions from a low level to a high level, an output signal PF_FSR1 of the third register 328 goes to a low level by a low level signal pf_fM1FAIL outputted from the first register 314, as shown in FIG. 16C. It means that program operation related to the memory cell array 200a passes. An output signal PF_FSR2 of the third register 328 continuously retains a high level by a high level signal pf_fM2FAIL outputted from the second register 316, as shown in FIG. 16C. It means that the program operation related to the memory cell array 200a fails.

Figure 16D:
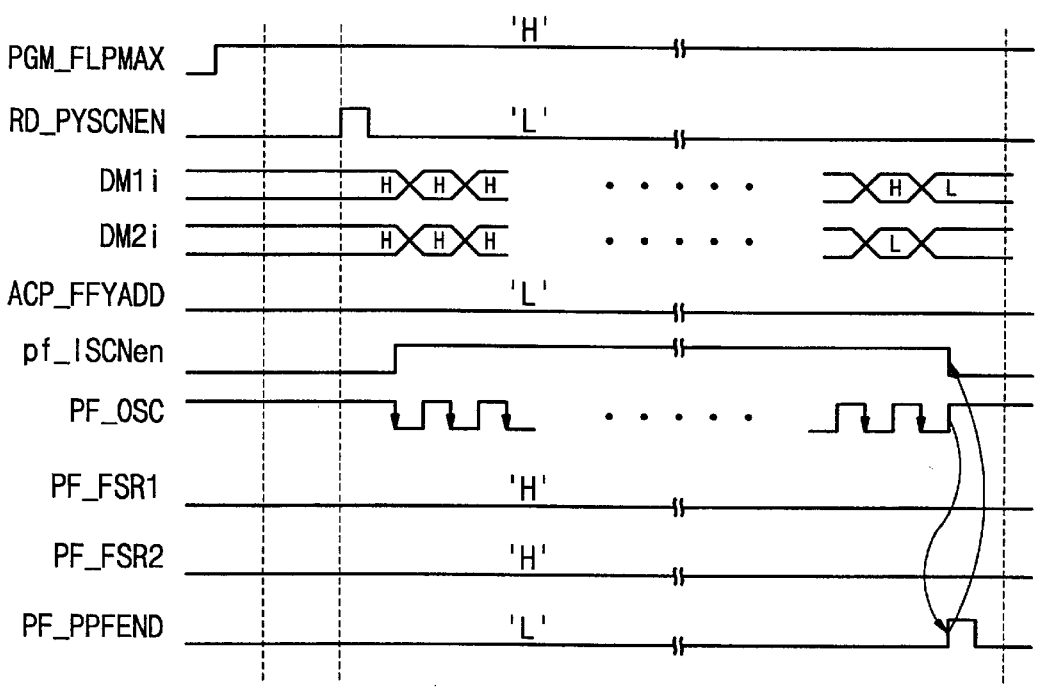

Referring to FIG. 16D, when, for example, the second data DM2$i$ is checked to be insufficiently programmed while a signal PGM_FLPMAX retains a high level (i.e., Y-SCAN operation of a final program cycle is carried out) (step S250), an output signal pf_dM2FAIL of the data status detection circuit 312 goes to a high level. Because a program cycle which is being performed is final, a low level signal pf_dM2FAIL is stored in the second register 316. Similarly, a low level signal pf_dM1FAIL is stored in the first register 314. Consequently, the output signal pf_fM1FAIL of the first register 314 retains a low level while the output signal pf_fM2FAIL of the second register 316 transitions from a low level to a high level. Although the signal pf_dM2FAIL goes to a high level, the disable signal PF_PPFEND continuously retains a low level. This is because the program cycle which is being performed is final and the signal ACP__FFYADD is at a low level. The disable signal PF__PPFEND continuously retains a low level because only one of the signals pf__fM1FAIL and pf__fM2FAIL inputted from the AND-type gate 536 is at a high level. Consequently, although the memory cell 200b is checked to be program fail, the address counter 240 increases a column address as much as "1" in response to high-to-low transition of the oscillation signal PF__OSC so as to select next columns of the memory cell array 200a, as shown in FIG. 16C. It means that program operation related to the memory cell array 200b fails.

If the first data DM1i is checked to be insufficiently programmed prior to creation of the final column address in the final program cycle, the signal pf__dM1FAIL goes to a high level. Because the program cycle which is being performed is final a high level signal pf__dM1FAIL is also stored in the first register 314. This leads to low-to-high transition of the output signal pf__fM1FAIL of the first register 314. Because all the input signals pf__fM1FAIL and pf__fM2FAIL are at a high level, as shown in FIG. 16D, the disable signal PF__PPFEND transitions from a low level to a high level. Accordingly, the oscillation control signal pf__1SCNen is disabled to a low level. That is, the oscillator 326 is not operated any longer. Because each of the signals pf__fM1FAIL and pf__fM2FAIL outputted from the first and second registers 314 and 316 retains a high level, the flag signals PF__FSR1 and PF__FSR2 outputted from the third register 328 retain an initially set state. It means that all programs related to the memory cell arrays 200a and 200b fail.

As explained above, since program pass/fail check operation is performed using data bits selected by a column gate circuit according to a column address including redundancy information, a defective bitline (bitlines) has no influence upon the operation. Hence, a nonvolatile semiconductor memory device is not regarded as a fail device to prevent yield deterioration.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A nonvolatile semiconductor memory device comprising:
   a memory cell array having a plurality of rows, a plurality of columns, and a plurality of memory cells coupled with the rows and columns, respectively;
   a read-out circuit for reading and holding data bits programmed from the memory cell array through the columns;
   a column selection circuit for partially selecting the columns;
   a program status detection circuitry for detecting whether all data bits outputted from the column selection circuit are involved in a program state during program pass/fail check operation of a program cycle, generating a pulse signal; and
   an address counter for creating a column address in response to the pulse signal,
   wherein the column selection circuit partially selects the columns in response to the column address.

2. The device of claim 1, wherein the memory cell array further comprises a plurality of redundant columns for substituting defective ones of the columns.

3. The device of claim 2, wherein the column selection circuit comprises a column decoder for decoding a column address outputted from the address counter, a column gate circuit for selecting the columns in response to a column address decoded by the column decoder, and a redundancy circuit for receiving the column address,
   wherein, when columns corresponding to the column address include at least one defective column, the redundancy circuit disables the column decoder and the defective column substitutes for a corresponding redundant column via the column gate circuit.

4. The device of claim 1, wherein the program status detection circuitry includes:
   a circuitry which receives data bits corresponding to the selected columns, out of the data bits held to the read-out circuit, and generates the pulse signal when all of the received data bits are involved in a program state; and
   a pass/fail check circuit which generates a pass/fail flag signal for informing program pass and program fail in response to the pulse signal and the column address.

5. The device of claim 4, wherein the circuitry includes:
   a data status detection circuit which detects whether each of the programmed data bits corresponding to the selected columns is involved in a program state, generating an oscillation control signal; and
   an oscillator which generates the pulse signal in response to the oscillation control signal.

6. The device of claim 5, wherein the data status detection circuit enables the oscillation control signal when all of the programmed data bits corresponding to the selected columns are involved in a program state, so that the pulse signal for increasing the column address is generated.

7. The device of claim 6, wherein the data status detection circuit disables the oscillation control signal when at least one of the data bits is insufficiently involved in a program state, so that the pulse signal is not generated.

8. The device of claim 5, wherein the program pass/fail check circuit generates the pass/fail flag signal of a first logic state informing program pass when the oscillation control signal is enabled and all bits of the column address are at the first logic state, and generates the pass/fail flag signal of a second logic state informing program fail when the oscillation control signal is enabled and at least one of the address bits is at the second logic state.

9. The device of claim 1, wherein the address counter includes a counter circuit.

10. The device of claim 1 including a NAND-type flash memory device.

11. The device of claim 1, wherein the program cycle is compose of program operation, verifying read-out operation, and program pass/fail check operation, and is repeatedly carried out as many as predetermined times.

12. The device of claim 11, wherein, when one of the data bits transmitted through the column selection circuit is checked to be insufficiently programmed during program pass/fail check operation of an optional program cycle, the optional program cycle is finished and a next program cycle is carried out, and a starting column address of the program pass/fail check operation in the next program cycle is a column address which is finally used in program pass/fail check operation of the optional program cycle.

13. A nonvolatile semiconductor memory device comprising:

a first and second memory cell arrays;

a column selection circuit for partially selecting columns of the first and second memory cell arrays;

a program status detection circuitry for detecting whether all data bits transmitted through the column selection circuit, corresponding to the first and second memory cell arrays during program pass/fail check operation of a program cycle, are involved in a program state, generating a pulse signal; and an address counter for generating a column address in response to the pulse signal, wherein each of the first and second memory cell arrays includes a plurality of rows, a plurality of columns, a plurality of memory cells arranged in each cross region of the row and columns, and a read-out circuit for reading and holding data bits programmed to a corresponding to memory cell array through the columns; and wherein the column selection circuit partially selects the columns of the first and second memory cell arrays in response to the column address.

14. The device of claim 13, wherein the program cycle is composed of program operation, verifying read-out operation, and program pass/fail check operation, and is repeatedly carried out as many as predetermined times.

15. A method of programming a flash memory device with a memory cell array having a plurality of bitlines and a plurality of redundant bitline, the method comprising the steps of:

reading and holding data bits programmed from the memory cell array;

partially transmitting the programmed data bits in response to a column address; and checking whether the transmitted data bits are involved in a program state.

* * * * *

UNITED STATES PATENT AND TRADEMARK OFFICE
CERTIFICATE OF CORRECTION

PATENT NO. : 6,282,121
DATED : August 28, 2001
INVENTOR(S) : Cho et al.

It is certified that error appears in the above-identified patent and that said Letters Patent is hereby corrected as shown below:

Column 1,
Line 37, "PRGRAMMING" should read -- PROGRAMMING --.

Column 2,
Line 42, "dose" should read -- does --.
Line 66, "PD1-D1024" should read -- PD1-PD1024 --.

Column 3,
Line 43, "dose" should read -- does --.

Column 6,
Line 3, "detection circuit" should read -- detection circuitry --.
Line 63, "pate" should read -- gate --.

Column 8,
Line 54, "as follows. to In" should read -- as follows. In --.

Column 9,
Line 55, "PCMSCN" should read -- PGMSCN --.

Column 10,
Line 64, "PF_FSR" should read -- PF_FSR1 --.

Column 11,
Line 18, "pf_dM2FALL" should read -- pf_dM2FAIL --.
Line 26, "pf_dMFAIL" should read -- pf_dM1FAIL --.
Line 57, "pf_ISCNen" should read -- pf_1SCNen --.
Line 65, "pf_FM1FAIL" should read -- pf_fM1FAIL --

UNITED STATES PATENT AND TRADEMARK OFFICE
CERTIFICATE OF CORRECTION

PATENT NO.   : 6,282,121
DATED        : August 28, 2001
INVENTOR(S)  : Cho et al.

It is certified that error appears in the above-identified patent and that said Letters Patent is hereby corrected as shown below:

Column 12,
Line 14, "pf_M2FAIL" should read -- pf_fM2FAIL --.
Line 21, "pf_DMLFAIL" should read -- DM1FAIL --.
Line 28, "pf_SCNen" should read --pf_1SCNen --.
Line 40, "pf_SCNen" should read -- pf_1SCNen --.
Line 49, "D1" should read -- DI --.

Column 15,
Line 3, "Y-CAN" should read -- Y-SCAN --.
Line 34, "pscillation" should read -- oscillation --.

Signed and Sealed this

Twenty-third Day of April, 2002

Attest:

Attesting Officer

JAMES E. ROGAN
Director of the United States Patent and Trademark Office